United States Patent [19]
Akiba et al.

[11] Patent Number: 4,694,423
[45] Date of Patent: Sep. 15, 1987

[54] MAGNETIC BUBBLE MEMORY MODULE

[75] Inventors: Yutaka Akiba, Fujisawa; Kazuo Hirota, Chigasaki; Nobuo Kishiro, Mobara; Toshio Futami, Mobara; Tatsuo Hamamoto, Mobara, all of Japan

[73] Assignee: Hitachi, Ltd., Tokyo, Japan

[21] Appl. No.: 823,647

[22] Filed: Jan. 29, 1986

[30] Foreign Application Priority Data

| Jan. 31, 1985 [JP] | Japan | 60-15341 |
| Feb. 1, 1985 [JP] | Japan | 60-16540 |
| Apr. 1, 1985 [JP] | Japan | 60-66456 |

[51] Int. Cl.[4] .......................... G11C 19/08
[52] U.S. Cl. ................................. 365/2
[58] Field of Search ........................... 365/2

[56] References Cited

U.S. PATENT DOCUMENTS 4,165,535  8/1979  Mortelmans et al. ............ 365/2
4,592,015  5/1986  Akiba et al. ..................... 365/2

OTHER PUBLICATIONS

IBM Technical Disclosure Bulletin—vol. 21, No. 6, Nov. 1978, pp. 2285–2286.

Primary Examiner—James W. Moffitt
Attorney, Agent, or Firm—Antonelli, Terry & Wands

[57] ABSTRACT

A magnetic bubble memory module having a rectangular core shaped like a picture frame providing windings on respective two pairs of opposite sides, at least one magnetic bubble memory chip disposed in an area surrounded by the core, a flexible substrate having a chip-loading section for loading the magnetic bubble memory chip thereon and having four corners for leading out lead wires connecting signal lines and driving lines of the chip. A revolving magnetic field-confining case accommodates the core, the chip and the flexible substrate and enables the lead wires of the flexible substrate at the corners of the chip-loading section to be drawn out therethrough.

9 Claims, 55 Drawing Figures

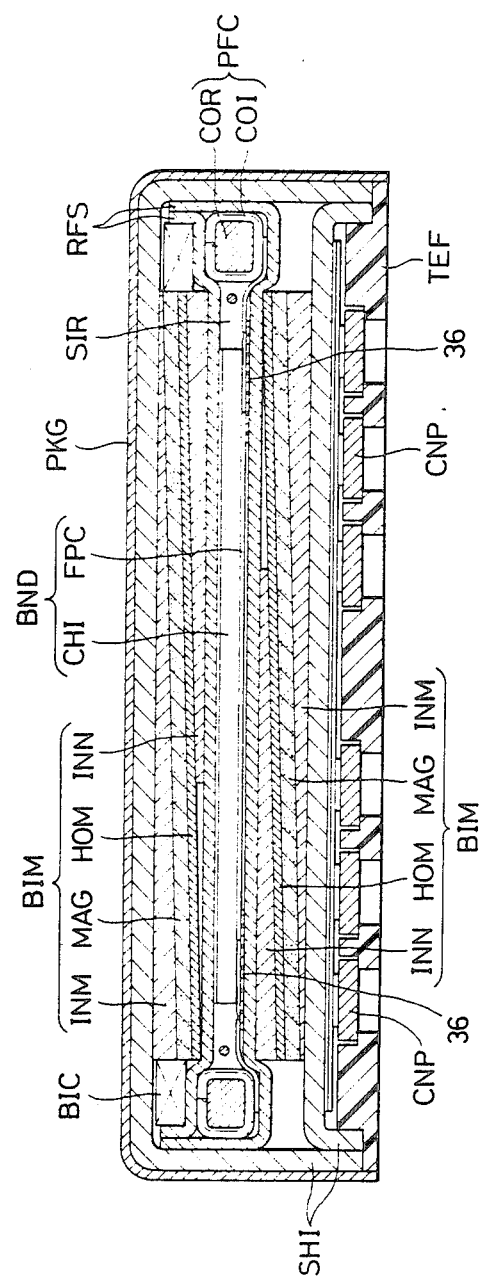

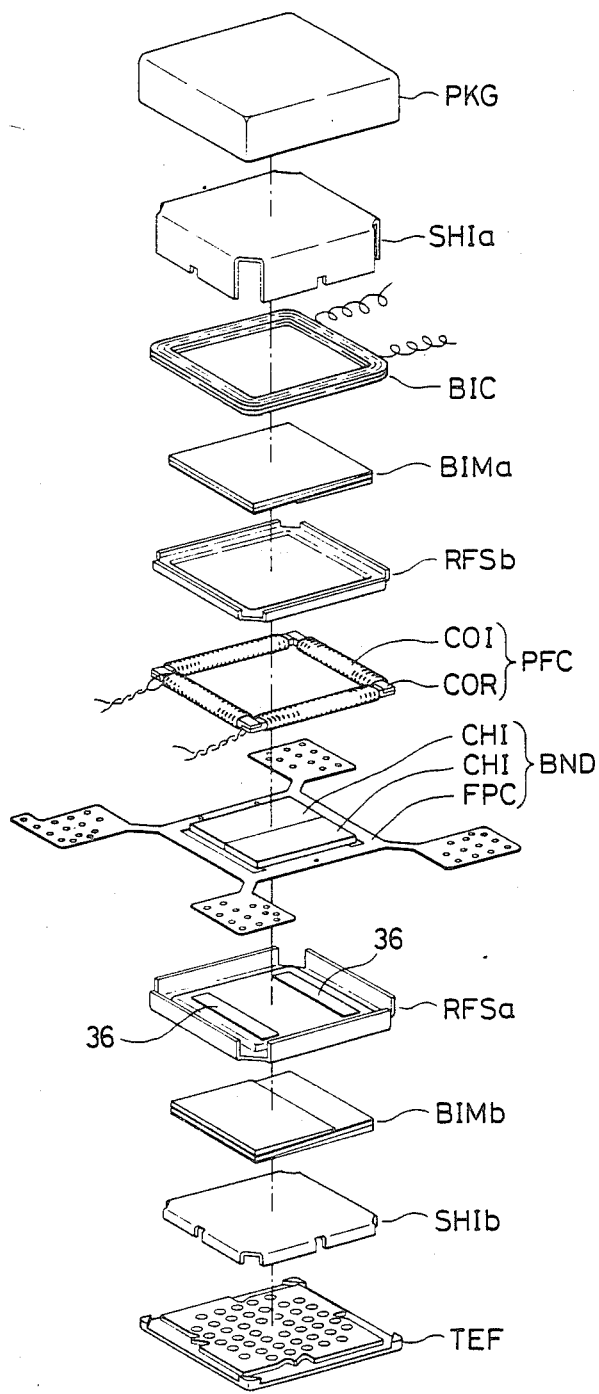

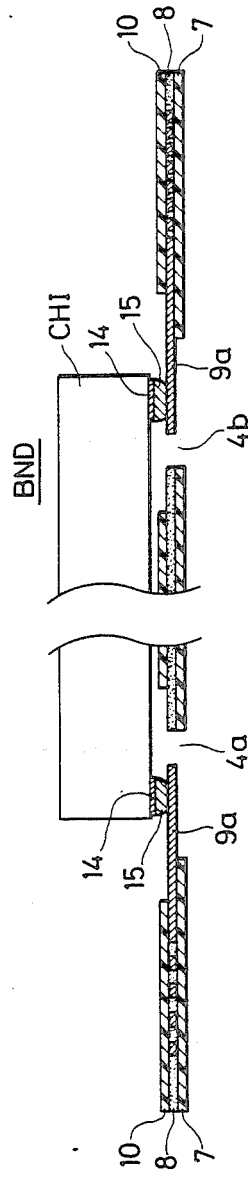
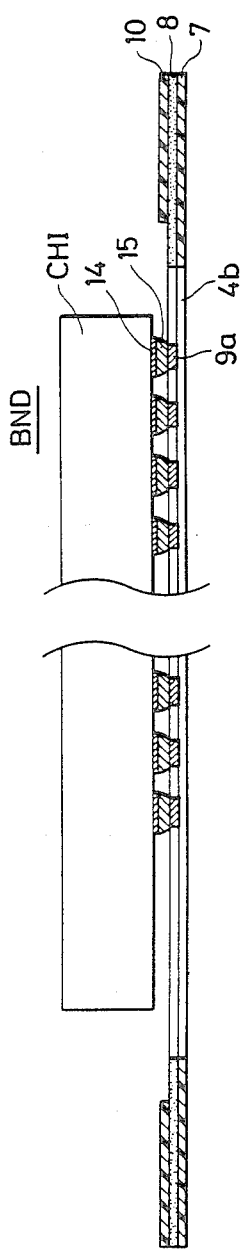
FIG. 7A
FIG. 7B

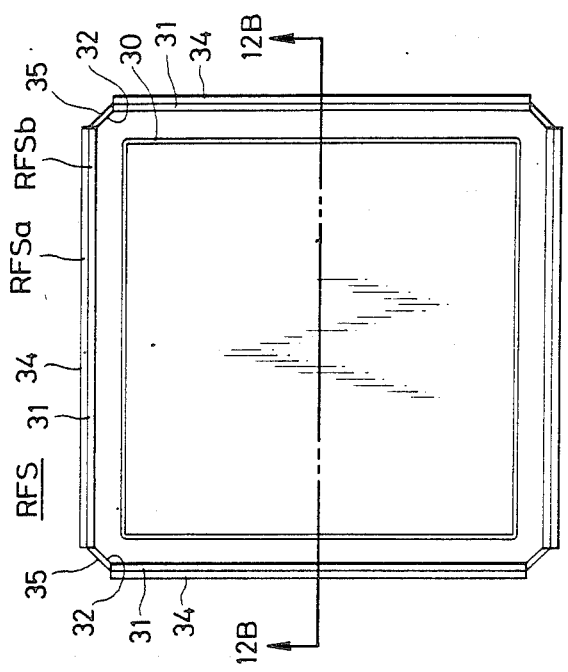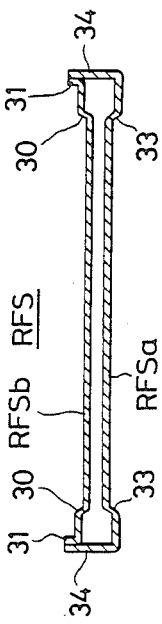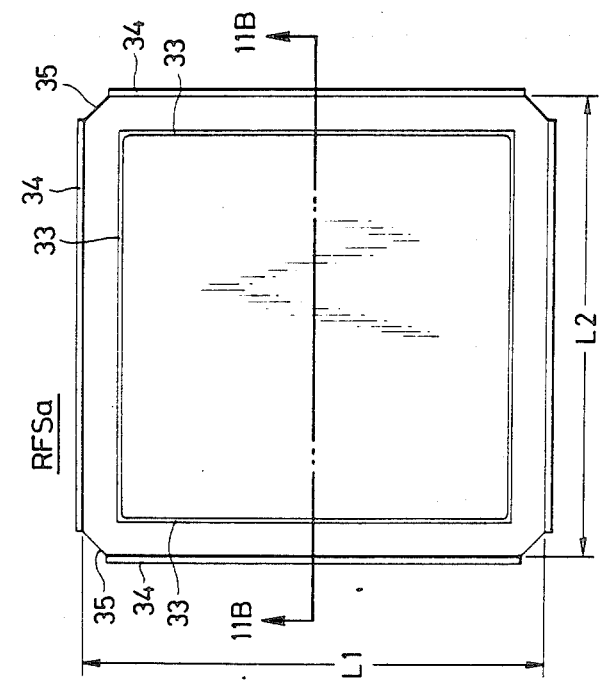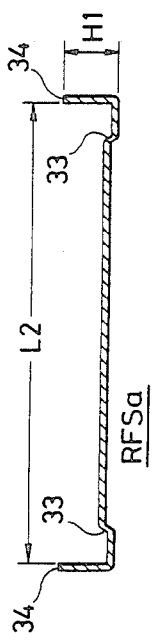

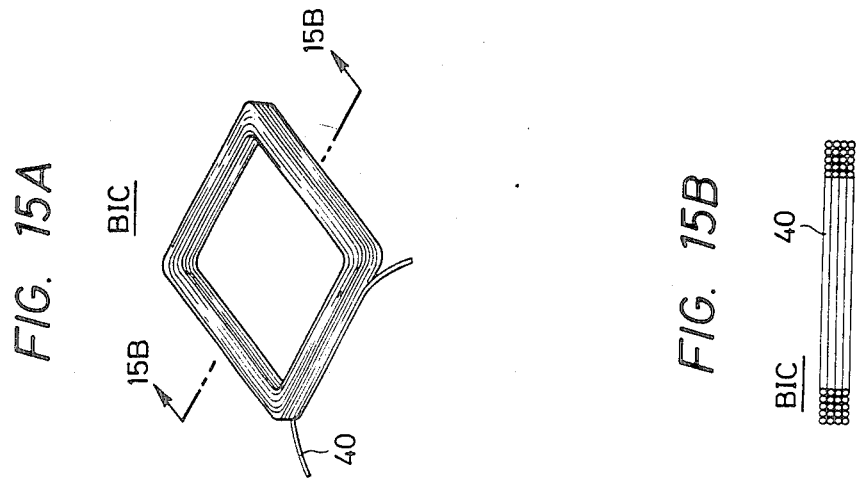
FIG. 15A
FIG. 15B
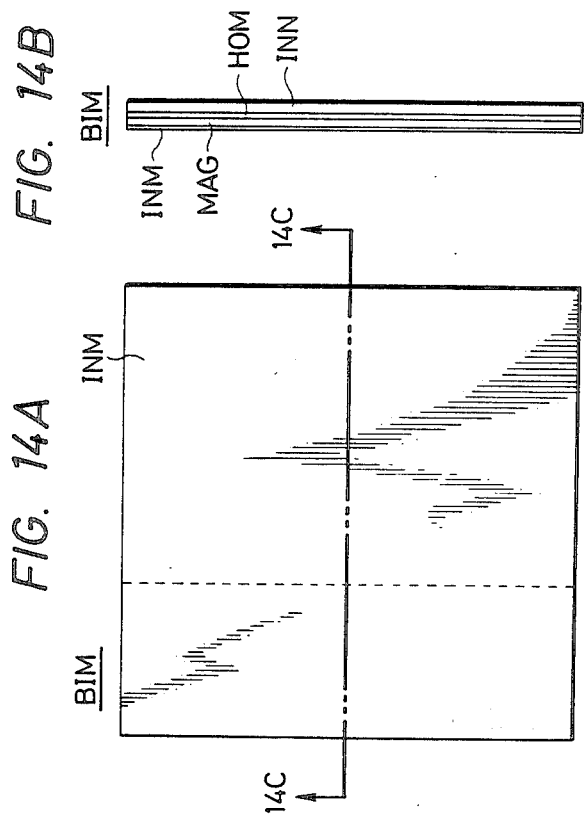
FIG. 14B
FIG. 14A
FIG. 14C

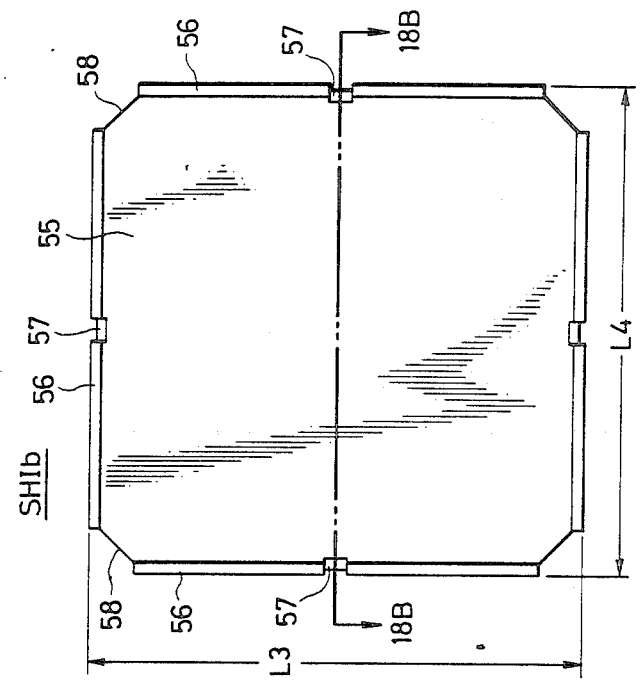 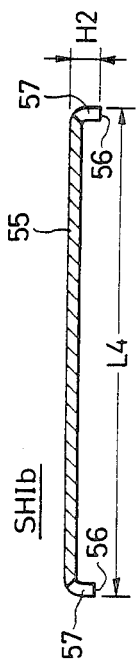
FIG. 17A  FIG. 17B
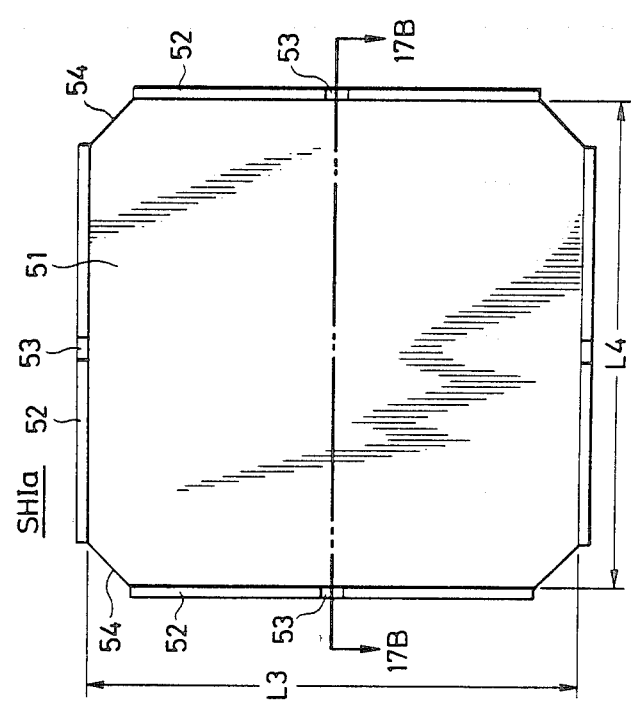 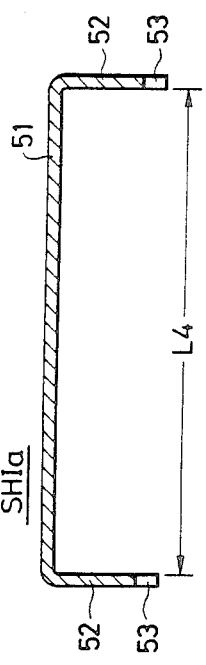
FIG. 18A  FIG. 18B

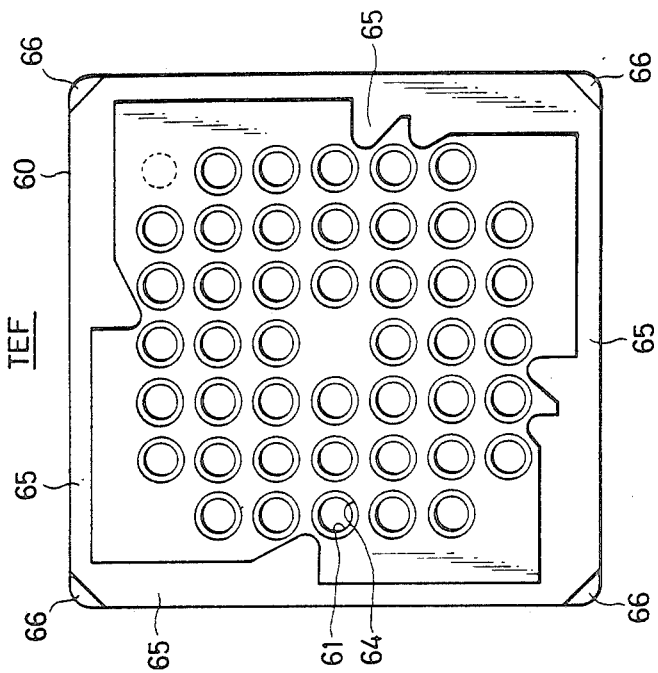
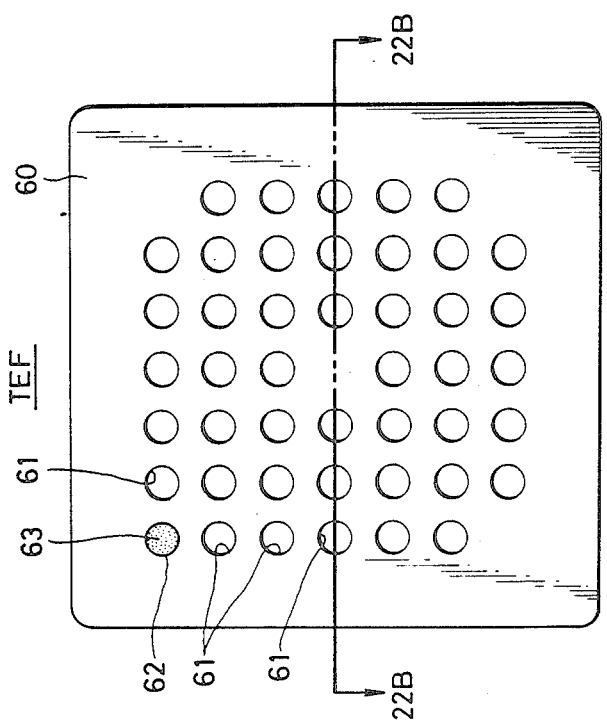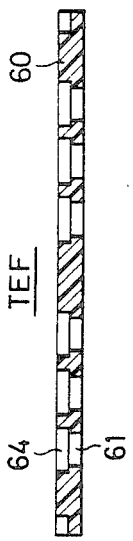

LENGTH IN THE x-AXIS DIRECTION

MAGNETIC BUBBLE MEMORY MODULE

BACKGROUND OF THE INVENTION (a) Field of the Invention

The present invention relates to a magnetic bubble memory module and particularly to a magnetic bubble memory module which is suitable for thinning and miniaturizing its body lowering consumption and ameliorating efficiency of composition.

(b) Description of the Prior Art

The magnetic bubble memory module realized in these years has the structure wherein an X-coil and a Y-coil for generating a revolving magnetic field which are respectively composed of square solenoid coils having non-symmetric structures with each other are respectively inserted to E-like substrates made of ceramic, synthetic resin or the like mounting a magnetic bubble memory chip and are arranged at a right angle with each other. The X-coil and the Y-coil must be provided around not only a magnetic bubble memory chip but also a substrate which is far larger than the chip. Thus, the length from one end of each coil to the other end thereof is made longer and thus the driving voltage and the power consumption are made larger. Further, the X-coil and the Y-coil supply a uniform and stable in-plane revolving magnetic field to the magnetic bubble memory chips and thus respectively require a uniform inductor balance. Thus, these coil forms are respectively required to have non-symmetric structures which are different from each other and to have large structures. Moreover, these coils respectively have the structure wherein there are arranged on the outside surfaces of the X-coil and the Y-coil a pair of permanent magnet plates for supplying vertical bias magnetic fields to each magnetic bubble memory chip and the plates for homogenizing their magnetic fields and these peripheral portions are covered with resin molds. Accordingly, their lamination thicknesses in the vertical direction are made larger and this enlargement has been made to be an obstacle to requirements for thinning and miniaturizing a magnetic bubble memory module.

As the closest prior art to the present invention of which the present inventors are aware, it is possible to cite the invention of U.S. Pat. No. 4,165,535. This specification discloses a structure of a picture frame core surrounding a chip and a conducting box for reflecting a magnetic field completely surrounding the core and the chip. However, it does not disclose more concrete structure than the above any more. For example, it is theoretically impossible to carry out electrical connection to a chip completely surrounded by a conductor case from the outside of the conductor case without short-circuiting with the conductor case. Further, it does not clearly disclose the method of mounting a permanent magnet, a plate for homogenizing a magnetic field, a bias coil and the like. Accordingly, the disclosure is apparently insufficient to be considered as a hint for trying to realize the present invention. Namely, as a result, the embodiment of the present invention just happens to coincide with the disclosure of the above-stated specification in the respect of employing a picture frame core for the embodiment of the present invention.

SUMMARY OF THE INVENTION

It is an object of the present invention to provide a magnetic bubble memory module which is designed to be thinned.

It is another object of the present invention to provide a magnetic bubble memory module which is designed to be miniaturized by making its overall bulk smaller.

It is a further object of the present invention to provide a magnetic bubble memory module which is designed to reduce its power consumption.

It is yet another object of the present invention to provide a magnetic bubble module which is designed to make a VI product smaller by diminishing inductance of a coil for generating a revolving magnetic field.

It is a still further object of the present invention to provide a magnetic bubble module which makes it possible or easier to be automated by ameliorating efficiency of composing components.

It is still another object of the present invention to provide a magnetic bubble module which has a capability of increasing connection terminals for inputs and outputs and the like in number in order to realize enlargement of the capacity and the like.

It is another object of the present invention to provide a magnetic bubble module which has a capability of easily and highly accurately arrangement of gradient angle to the direction of a bias magnetic field of a magnetic bubble memory chip.

It is another object of the present invention to provide a magnetic bubble module which has a capability of miniaturizing a cassette.

It is further another object of the present invention to provide a magnetic bubble module which is designed to ameliorate uniformity of a revolving magnetic field.

According to one embodiment of the present invention, it is possible to provide a driving magnetic circuit employing a picture frame core. The magnetic bubble memory is surrounded by the picture frame core and is disposed on a flexible substrate so as to be in the almost same level with the picture frame core. The driving magnetic circuit and the magnetic bubble memory chip are made of nonmagnetic materials and are accomodated in a case made of good conducting materials and for confining a revolving magnetic field. The construction disclosed above has a capability of ameliorating uniformity of a revolving magnetic field and miniaturizing and thinning an overall configuration.

BRIEF DESCRIPTION OF THE DRAWINGS

FIG. 2B is a sectional view on line 2B—2B of FIG. 2A. FIG. 3 is an exploded perspective view showing a laminating structure. FIGS. 7A and 7B are a view describing lead bonding of the substrate assembly BND. FIGS. 11A and 11B are a view showing an outer case RFSa. FIGS. 12A and 12B are is an assembly drawing of the case RFS. FIGS. 14A, 14B, and 14C are a view describing the construction of a magnet BIM. FIGS. 15A and 15B are is a view describing a bias coil BIC. FIGS. 17A and 17B are is a view showing an outer shield case SHIa. FIGS. 18A and 18B are is a view showing an inner shield case SHIb. FIGS. 22A, 22B, and 22C are is a view describing the construction of a terminalfixing plate TEF.

DETAILED DESCRIPTION OF PREFERRED EMBODIMENT

Next, the embodiments of the present invention will be described with reference to the drawings.

Figure 1:
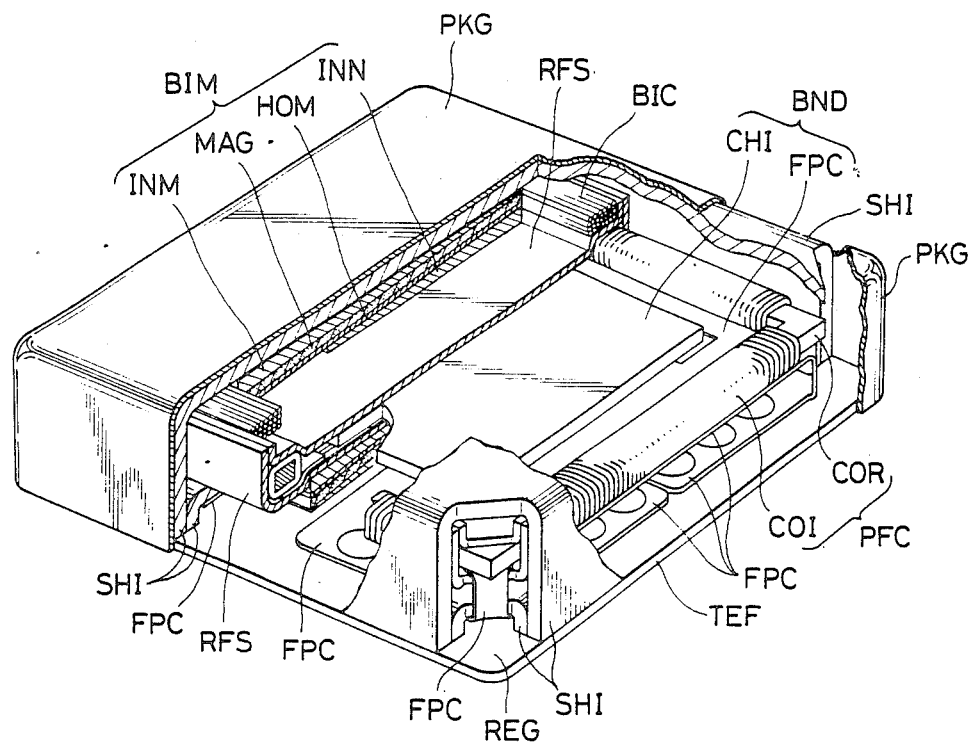
FIG. 1 is a partially broken perspective view showing an overall magnetic bubble memory module of the present invention.

(Summary of the overall structure; FIGS. 1 and 2)

Figure 2A:
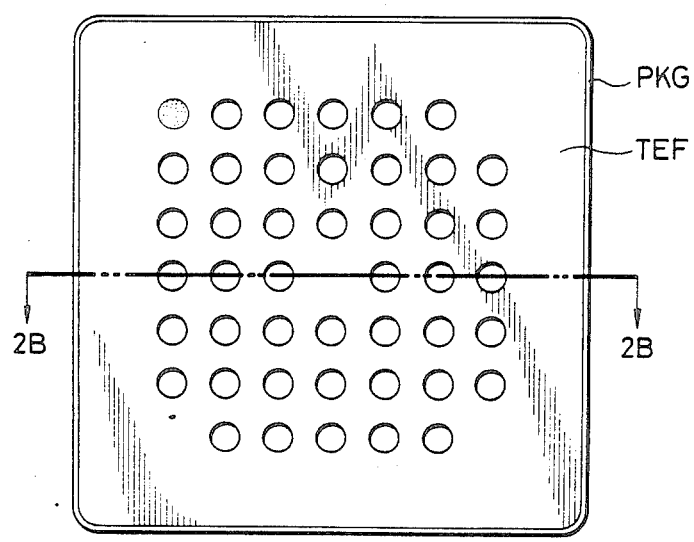
FIG. 2A is a bottom view.

FIGS. 1 and 2A and 2B are views for describing one embodiment of a magnetic bubble memory module according to the present invention. FIG. 1 is a partially broken perspective view. FIG. 2A is a bottom view thereof. FIG. 2B is a sectional view on the line 2B—2B of FIG. 2A. In these drawings, CHI denotes a magnetic bubble memory chip (hereinafter, referred as to a chip). In these drawings, only one chip CHI is shown by deleting the other, but in the present embodiment, it is to be understood that two chips are disposed side by side. (It is possible to obtain more excellent chip yielding by employing the construction wherein plural chips cover storage capacity conforming to a total of storage capacity than by empoying one chip construction). FPC denotes a flexible substrate loaded on two chips CHI and having line group extensions for connecting between the chip CHI and an outer connection terminal at four corners (hereinafter, referred as to a substrate).

COI denotes a driving coil surrounding two chips CHI in the almost same level therewith and disposed to make the opposite sides parallel with each other (hereinafter, referred as to a coil). COR denotes a picture frame core made of soft magnetic materials fixedly disposed so as to penetrate through a hollow portion of a square coil assembly COI (hereinafter, referred as to a core). This core COR and respective coils COI compose a magnetic circuit PFC for supplying an in-plane revolving magnetic field to the chip CHI.

RFS denotes a case for confining a revolving magnetic field which serves to accomodate a central square part of the substrate FPC and the while two chips CHI and magnetic circuit PFC (hereinafter, referred as to a case). The case RFS is formed by working two dependent plates and the upper and the lower plates are electrically connected at the side sections of the case. In this case RFS, there is formed a drawn section around the case so as to narrow a gap of a central part in a somewhat wider range than the part on which the chip CHI is disposed. This drawn section can be utilized for positioning a magnet stated after. The case RFS has two effects, that is, functions of confining a revolving magnetic field and mechanically supporting a weak substrate FPC.

Between the case RFS and the chip CHI, there exists a gap SIR especially at the sides of the chip CHI. However, silicon resin is coated on or filled with this gap SIR together with a plane section so as to try to bring about a passivation effect for the purpose of avoiding attaching extra things on the main surface of the chip when assembling the case and of lessening invasion of water on the main surface of the chip or the side sections thereof after assembling it. If airtight sealing is completely carried out at the outside of the case RFS, it is possible to delete the step of filling resin with the gap SIR.

INM denotes a pair of inclined plates made of magnetic materials disposed at the outside of the case RFS. In FIG. 2, the thickness of the upper side of the inclined plate INM is gradually made larger toward the left and that of the lower side of the inclined plate INM is gradually made larger toward the right. Both plates form inclined surfaces at the side of the case RFS. It is possible to employ materials with high permeability and small retentiveness Hc such as soft ferrite, Permalloy or the like as the materials of the inclined plate INM. In the present embodiment, soft ferrite is selected since it serves to facilitate working the inclined surfaces. MAG denotes a pair of permanent magnet plates disposed as putting each of them on the corresponding inside of a pair of inclined plates INM (hereinafter, referred as to a magnet plate). HOM denotes a pair of plates for homogenizing a magnetic field disposed as putting each of them on the corresponding inside of said each magnet plates and made of magnetic materials such as ferrite or the like. The magnet plate MAG is formed to wholly have an uniform thickness. INN denotes a pair of inclined plates disposed as putting each one of them on each corresponding inside plate of said plates for homogenizing a magnetic field and made of nonmagnetic materials with excellent thermal conductivity. These inclined plates INN are formed to have the almost same gradient with that of the inclined plate INM and the inclined surfaces in the reverse directions to them. The inclined plate INM, the magnet plate MAG, the plate HOM for homogenizing a magnetic field and the inclined plate INN are disposed as piling them and integrated so as to compose a magnet body BIM for generating a bias magnetic field (hereinafter, referred as to a magnet body), when the magnet body composed of laminated plates is formed to uniformly have the overall thickness. A pair of magnet bodies BIM are attached on a central plane section surrounded by the drawn sections of the case RFS.

BIC denotes a coil for generating a bias magnetic field disposed in a groove-like gap section between a peripheral portion of the magnet body BIM and the case RFS (hereinafter, referred as to a bias coil). The bias coil BIC is driven in case of arranging magnetism of the magnet plate MAG in accordance with the characteristics of the chip CHI or clearing all the bubbles of the chip CHI when there is accomplished the test as to fault of unnecessary-bubbles-generating.

SHI denotes an outer magnetic shield case made of magnetic materials and for accomodating the case RFS in which the substrate loaded with said chip CHI and the magnetic circuit PFC are accomodated and, at the outside of the case, a pair of magnet bodies BIMa, BIMb and the bias coil BIC (hereinafter, referred as to a shield case). For the materials of the shield case SHI, it is preferable to employ the magnetic materials with high permeability $\mu$, large saturated flux density Bs and small retentiveness Hc. Permalloy or ferrite has such a characteristic, but the present embodiment selects iron-nickel alloy of Permalloy which is suitable for bending operation and can endure mechanical external force.

PKG denotes a packaging case made of materials with high thermal conductivity and workability such as aluminum and mounted on the outer peripheral surface of said shield case SHI by attaching or engaging. CNP denotes a contact pad provided as extended from the four corners of said substrate FPC and disposed to be in contact with an outer connection terminal bent out to the rear surface of the shield case SHI. TEF denotes a terminalfixing plate made of insulating materials and for fixedly supporting each contact pad CNP at an interstage portion of the opening. REG denotes resin mold agent enclosed at the inside four corners of the packaging case PKG and for fixing the assembly of the shield case SHI to the inside of the packaging case PKG.

(Features of the overall structure; FIGS. 1 and 2)

It is possible to list the features of the magnetic bubble memory module shown in FIGS. 1 and 2 as follows. However, the features of the present embodiment should not be defined as follows. The other features will be obvious from the descriptions stated after FIG. 3, but, herein, the features are referred as mainly taking relations among respective components.

(1) Since the magnetic circuit PFC for generating a revolving magnetic field is made to be a picture frame type and the bubble memory chip CHI is arranged to be on the almost same level with the picture frame and within the frame, the thickness of the overall bubble module can be made thin. In the current techniques in these days, the X-and Y-coils are provided around the upper and the lower surfaces of the chip. Thus, the thickness of the overall device is a function of a sum of a chip thickness, a X-coil thickness and a Y-coil thickness.

(2) Since the X-coil and the Y-coil are disposed on the almost same level with each other, the following effects can be brought about in comparison with the conventional structure wherein the Y-coil is provided around the X-coil.
  (1) The length of total windings of a coil is not made so long. Thus, it is possible to lower inductance L and to realize the lowering of a driving voltage and power consumption.
  (2) Since the distances between the chip CHI and the X-coil and between the chip CHI and the Y-coil are made to be equal to each other, it is possible to take a balance of a distribution of a magnetic field (amelioration of uniformity).
  (3) The magnetic circuit PFC for generating a revolving magnetic field is surrounded by the case RFS. Thus, the leakage of a magnetic flux can be hardly brought about and thus it is possible to heighten driving efficiency in relation to the chip CHI.

(4) The case RFS has selectivity, that is, it serves to prevent leakage of an alternating magnetic field generated in the coil COI for generating a revolving magnetic field to the magnet body BIM with large permeability $\mu$ and on the contrary not to prevent substantial passage of a series magnetic field in the bias magnetic field Hb to be added from the magnet body BIM to the chip CHI.

(5) The case RFS employs harder materials such as copper in comparison with epoxy glass or the like conventionally utilized as a substrate. Thus, it is possible to mechanically, that is, strongly support the chip CHI. Accordingly, in case of employing a plural-chips-mounting arrangement on account of raising a producing yield, the difference of a gradient between the chips serves to greatly influence a magnetic characteristic, but the present embodiment can suppress the difference of a gradient between the chips.

(6) Since the flexible substrate FPC is employed as a substrate, the following effects can be obtained.
  (1) The substrate thickness can be made small.
  (2) This embodiment can employ a lead bonding method. Thus, it is possible to make the thickness of the bonding portion smaller in comparison with the conventional wire bonding method.
  (3) The above-stated effects 1 and 2 serve to make a gap of the magnetic circuit (the part with small permeability $\mu$) smaller and to employ the magnet plate MAG having a small thickness or a small plane area. They can be brought to thinning the overall module or reducing a plane area.
  (4) It is possible to freely bend wirings from the chip CHI. Thus, it is possible to turn a terminal section out about 180° and to restrict the plane area of the overall module.
  (5) It is possible to diminish in size the width of an opening for picking up wirings of the case RFS for confining a revolving a magnetic field. Thus, the leakage of a revolving magnetic field can be minimized.

(7) The outer lead-out wirings of the substrate FPC are aggregated at the corner sections of the square. Thus, it is possible to provide an opening of the case RFS for confining a revolving magnetic field at the corner section which is least influenced.

(8) Since the function of the inclined plate INN does not have both functions as a magnet and homogenizing a magnetic field, the following effects can be brought about.
  (1) It is possible to employ materials with excellent workability such as copper or the like in order to form a gradient.
  (2) It is possible to employ materials with excellent thermal conductivity such as copper or the like and to efficiently dissipate the heat generated in the coil COI for generating a revolving magnetic field.
  (3) By using non-magnetic materials, it is possible to prevent disturbance of a magnetic field passed through the plate HOM for homogenizing magnetic field.

(9) It is preferable to thin the inclined plate INN as much as possible in order to diminish a magnetic gap. By restricting the width of the plate INN so as to be a required and sufficient value for forming a gradient more than those of the magnet plate MAG and the plate HOM for homogenizing a magneti field, the formation of a gradient in a thin plate can be facilitated.

(10) The inclined plate INM made of materials with large permeability $\mu$ such as ferrite or the like is inserted between the magnet plate MAG and the shield case SHI. Thus, it is possible to bury a magnetic gap therebetween. Further, the plate INM can contribute heat-dissipation. Since the plate INM employs the material with smaller retentiveness than that of the magnetic plate MAG, it is possible to keep an effective thickness of the permanent magnet as an uniform state.

(11) The shield case SHI is composed of magnetic materials with large permeability $\mu$ such as Permalloy or the like. Thus, it is possible to diminish magnetic resistance of the magnetic circuit having the magnet plate MAG as a magnetic field source. As a result, the thickness of the magnet plate MAG and the plane area thereof can be made smaller.

(12) The shield case SHI is composed of magnetic materials with large saturated flux density Bs. Thus, it has a function of bypassing a magnetic noise from the outside and preventing transmission of it to the chip CHI.

(13) The above-stated respects (11) and (12) brings to thinning the thickness of the shield case SHI.

(14) The shield case SHI employs as its material an iron-nickel alloy such as Permalloy. Thus it is suitable for bending operations and serves to protect the parts incorporated therein from mechanical external force.

(15) Since the magnetic circuit PFC for generating a revolving magnetic field and the bias coil BIC are formed as core types, the accomodating efficiency or the mounting density in the case RFS, SHI or PKG can be made higher.

(16) Since the case RFS is inserted between the core COR and the plate HOM for homogenizing a magnetic field, the interval therebetween can be minutely arranged by the thickness and the bending angle of the case for confining a revolving magnetic field RFS in addition to the thickness of the coil COI. As this interval is made shorter, the overall plane area can be made smaller. This can lead to lowering power consumption by means of reducing coil length. However, in case the interval is too short, the series bias magnet field Hb emitted from the magnet plate MAG is leaked to the core COR with high permeability. As a result, the uniformity of the bias magnetic field around the chip is deteriorated. Accordingly, this interval is very important to the above-stated characteristics. According to the present structure, it is possible to minutely arrange the interval.

(17) The drawn section is provided around the case RFS for confining a revolving magnetic field. Thus, it is easy to accomplish positioning of the magnet body BIM.

(18) The two inclined plates INN manufactured under the same manufacturing conditions with each other are disposed so as to have 180° of rotation angle difference between the upper and the lower surfaces on the plane. Thus, it is possible to position in almost parallel a pair of plates for homogenizing a magnetic field HOM and a pair of magnets MAG disposed upwardly of and downwardly of the chip.

(Summary of assembling; FIG. 3)

FIG. 3 is a perspective view as to assembling for describing the order of pile-assembling respective components composing the above-stated magnetic bubble memory module. The same characters with the above-stated description show the same components. In this Figure, at first, the substrate assembly BND assembled by loading two chips CHI on the substrate FPC having connecting sections for input and output wirings projected at 4 corners and a chip-loading section at the central portion is disposed in an outer case RFSa on which insulating sheets 36 are disposed by attaching. Further, after the magnetic circuit PFC is incorporated in this substrate FPC, the substrate is filled with silicon resin STR (not shown). From the upper part, the inner case RFSb is engaged with the outer case RFSa and the side-contact portion between the outer case RFSa and the inner RFSb is electrically connected by means of soldering or the like.

Next, an upper magnet body BIMa and a lower magnet body BIMb are disposed on the concave drawn section provided on the outer surfaces of these outer case RFSa and inner case RFSb and then the bias coil BIC wound in order is disposed on the gap (not shown) formed by an outer edge section of this upper side magnet body BIMa and the inside of the inner case RFSb. These are accomodated in the outer shield case SHIa and further the inner shield case SHIb is incorporated therewith. Next, the side-contact portion between the outer shield case SHIa and the inner shield case is electrically connected.

Figure 4A:
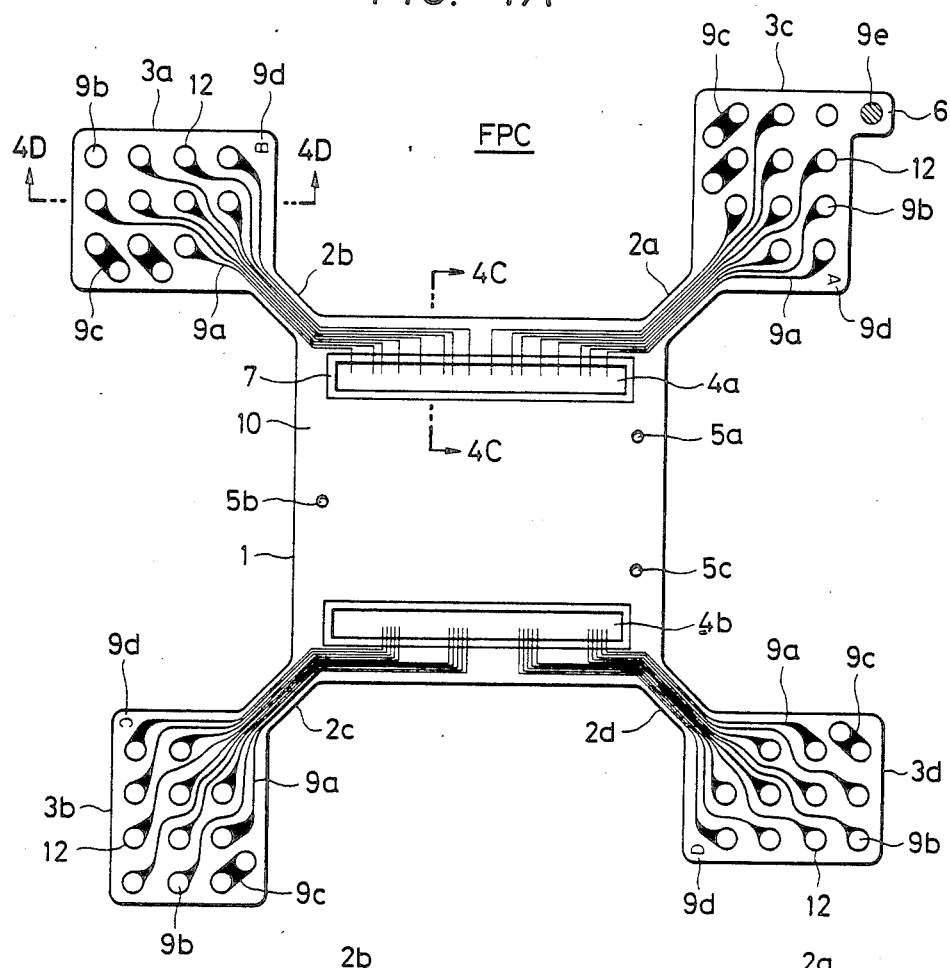
FIGS. 4A, 4B, 4C, and 4D are a view describing a substrate FPC.
Figure 4B:
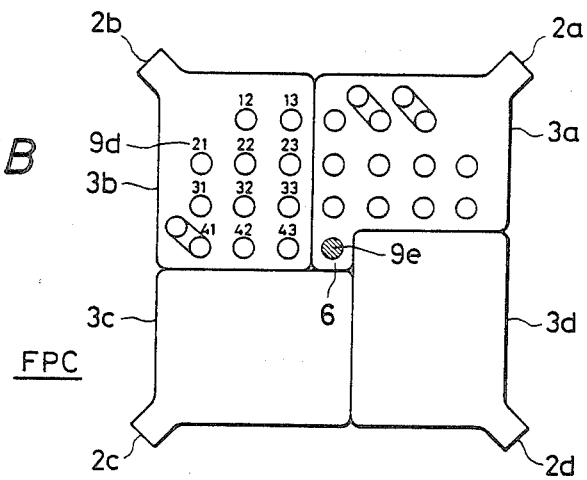

Then, the outer connection terminal-connecting sections of said substrate FPC projected at the four corners of the shield case SHI are bent to the rear surfaces of the inner shield case SHIa as shown in FIG. 4B and are incorporated so as to have a fixed form. A terminal-fixing plate TEF loaded with contact pads CNP at respective openings is disposed in contact with respective outer connection terminals covered by soldering or the like respectively provided at said terminal-connecting sections and respective outer connection terminals and the contact pads CNP are electrically connected with each other by means of soldering or the like.

Next, the assembly of them is accomodated in the packaging case PKG and the sealing such as hermetic sealing or the like is accomplished at the contact portions between the terminal-fixing plates TEF and the packaging case PKG so as to complete the assembling.

Next, the structure of the above-stated respective components are described.

(Flexible substrate; FIG. 4)

FIG. 4 shows the substrate FPC. FIG. 4A is a plan view showing it. FIG. 4B is a plan view showing the connecting sections of the outer connection terminals projected at 4 corners, which are bent to the assembly. FIG. 4C is an enlarged sectional view taken on the line 4C—4C in FIG. 4A. FIG. 4D is an enlarged sectional view taken on the line 4D—4D in FIG. 4A. In these drawings, the substrate FPC includes a rectangular chip-loading section 1 at the central part, sections to be bent 2 (2a, 2b, 2c, 2d) whose widths are small at the four corners and rectangular outer connection terminal-connecting sections (hereinafter, referred as to a connecting section) 3 (3a, 3b, 3c, 3d), which are integrally formed so as to wholly have an almost windmill-like form.

Further, on the facing sides of this chip-loading loading section 1, there are provided double-frame structure of square or rectangular openings 4 (4a, 4b) to be loaded with the two chips CHI stated after and to be connected with the terminal sections thereof and three holes 5 (5a, 5b, 5c) for positioning and there is provided a projection 6 for positioning at the tip of the connecting section 3c.

Figure 4C:
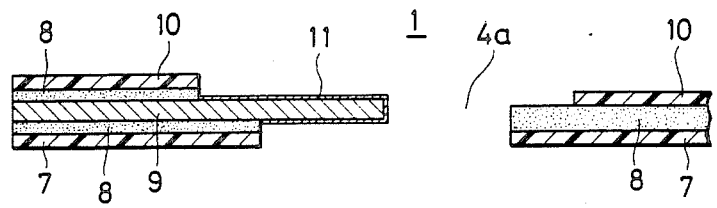

Further, in this substrate FPC, the patterns of lead wires 9a, circular outer terminals 9b, ellipsoidal coil lead-connecting terminals 9c notes 9d, index marks 9e and the like as shown in FIG. 4A are formed by means of forming a copper thin film on a base film 7 made of a polyimide resin film with, for example, about 50 $\mu$m of thickness on which on epoxy system adhesive agent is coated as shown in FIG. 4C and then accomplishing etching of these films so as to form a required pattern. Further, a transparent or semi-transparent cover film 10 is attached and disposed on the upper surface of these films on which the adhesive agent 8 consisting of the same components with the above-stated agent is coated.

Figure 4D:
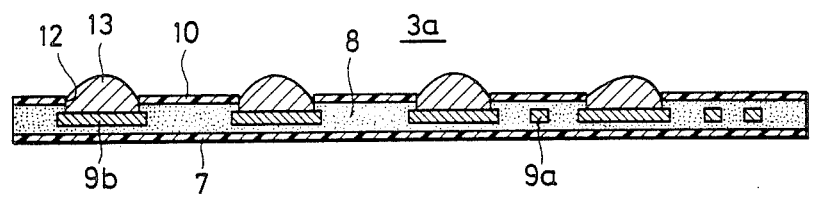

And, in the opening 4 of this substrate FPC, an opening is formed on the base film 7 to be a chip CHI-loading side not shown in the drawings to tightly restricted dimensional tolerance. Then, an opening in relatively large dimensions is formed on an upper surface side cover film 10. Further, the lead wires 9a are exposed between the base film 7 and the cover film 10 and on the surface of these lead wires 9a, there is formed a tinning layer 11. Consequently, the opening form has a two-layered structure and at once a double-frame structure. On the other hand, in the connecting section 3, as shown in FIG. 4D, circular openings 12 are formed on the portions corresponding with said circular outer terminals 9b of the cover film 10 and elliptical outer terminals 9c not shown in the drawings and a soldering layer 13 by plating, dipping or the like is formed on the copper thin film patterns of the outer terminals 9b and 9c exposed from the opening 12. And, respective outer terminals 9b and 9c provided at these connecting sections 3 are connected to respective lead wires 9a continuously formed on the chip-loading section 1, respective connecting sections 3a, 3b, 3c, 3d and respective bending sections 2a, 2b, 2c, 2d. These lead wires 9a are aggregated as respective blocks of respective connecting sections 3a, 3b, 3c, 3d at a part of respective opening edges of respective openings 4a, 4b and these tips of respective blocks are exposed in respective openings 4a, 4b. Namely, as shown in FIG. 4A, the lead wire 9a of the connecting section 3a is disposed at the left upper part of the opening 4a. The lead wire 9a of the connecting section 3b is disposed at the left lower part of the opening 4b. The lead wires 9a of the connecting section 3c are disposed at the right upper part of the opening 4a. The lead wires 9a of the connecting section 3d are disposed at the right lower part of the opening 4b.

And this substrate FPC is constructed so as to easily discriminate those patterns by looking through the cover film 10, because, in the step stated after, respective connecting sections 3a, 3b, 3c, 3d are combined for engagement, as shown in FIG. 4B by bending respective sections to be bent 2a, 2b, 2c, 2d and respective outer terminals 9b, 9c on which the soldering layer 13 is formed are exposed to the surface and further, the surfaces of the lead wires 9a, the note 9d and the index mark 9e are covered by the cover film 10.

Under this construction, the substrate FPC employs a polyamide resin film and is constructed to have a windmill-like form providing respective connecting sections 3a, 3b, 3c, 3d through respective sections to be bent 2a, 2b, 2c, 2d at the four corners of the chip-loading section 1. By constructing the outer terminal sections by bending and engaging these connecting sections 3a, 3b, 3c, 3d with one another, the chip-loading section 1 and the connecting sections are made to have two-layered wiring structures. Thus, without diminishing the area of the connecting sections 3, the area of the chip-loading section 1 is made larger and at once the outer terminal section can be made to have plural terminals. Accordingly, the overall form can be minimized.

Further, under the above-stated construction, it is possible to greatly shorten the lead wires 9a from respective outer terminals 9b to respective openings 4a, 4b of the chip-loading section 1. Thus, the influence caused by an external noise and the like can be greatly diminished. It means that it is possible to input and output a signal with a high S/N ratio. Further, by providing the projection 6 at one end of the connecting section 3c and at once the index mark 9e at this projection 6, this index mark can facilitate the discriminations for indicating the central part of the substrate in case of bending and engaging these connecting sections, positioning in case of combining the substrate with the cases RFS and SHI (refer to FIG. 2), distinguishing a king of the lead wires 9a from another or indicating a production model or the like. Consequently, it is possible to rationalize assembling, controlling a substrate and the like. Further, by providing the openings 5a, 5b, 5c at both ends of the chip-loading section 1 of the substrate FPC, it is made to be easy to distinguish the right of the substrate FPC from the left thereof, position the chip CHI and the like and similarly it is possible to rationalize assembling efficiency.

Figure 5:
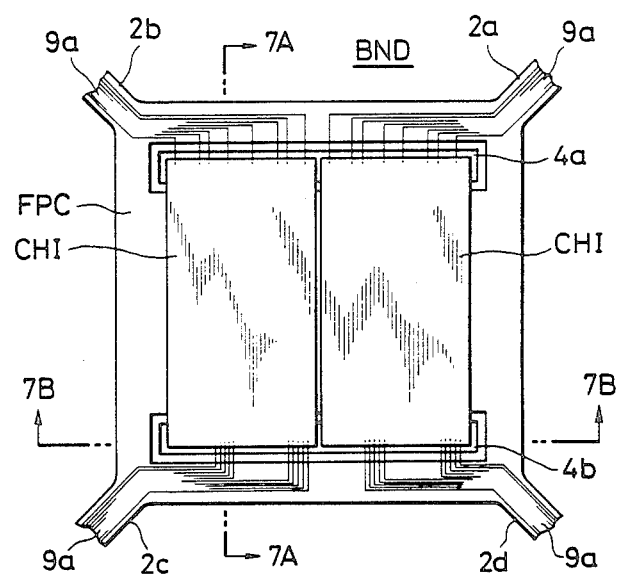
FIG. 5 is a plan view showing a substrate assembly BND where a chip CHI is loaded on the substrate FPC.
Figure 6:
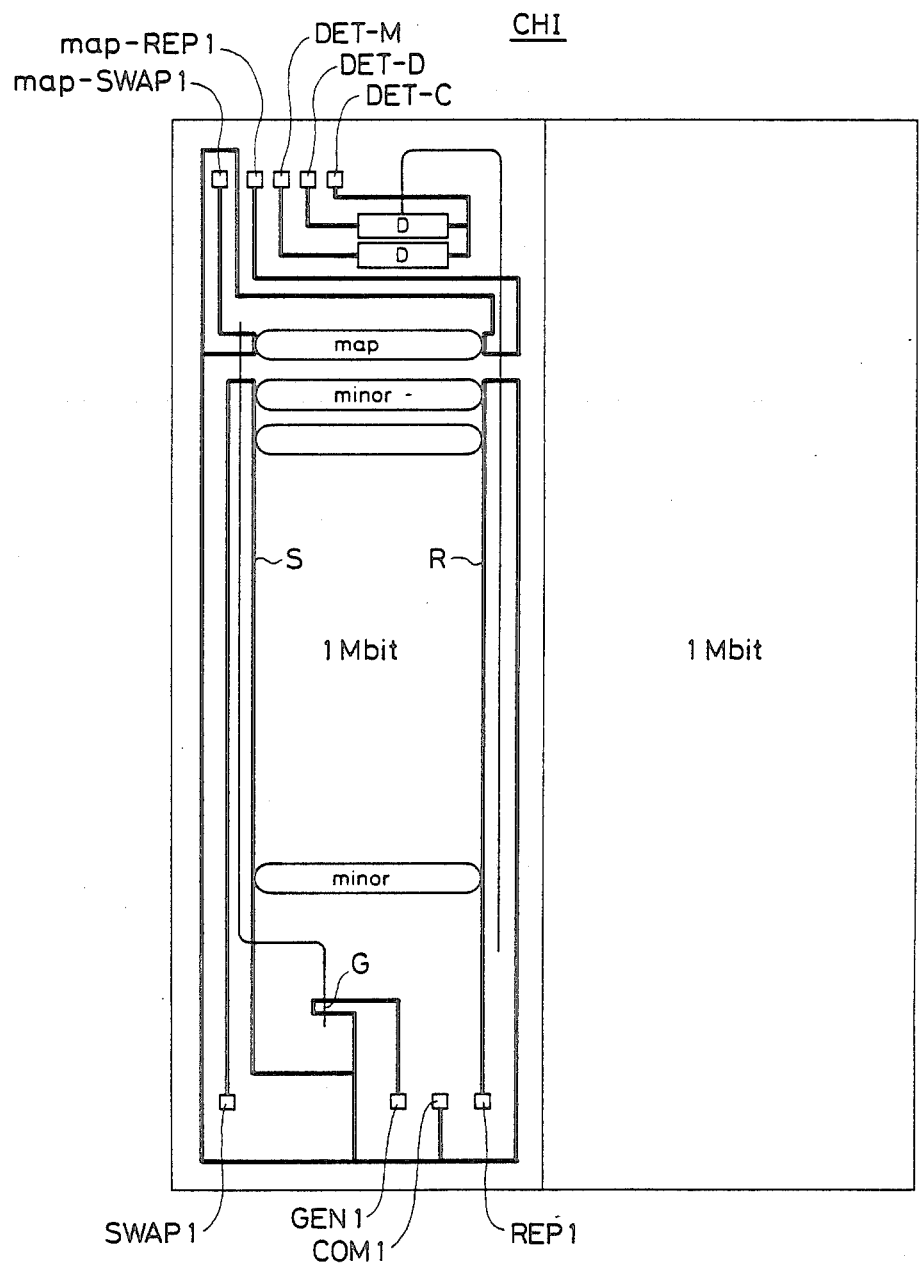
FIG. 6 shows a view showing the chip CHI.

(Substrate assembly; FIGS. 5, 6 and 7)

FIG. 5 is a plan view showing the construction wherein the chip CHI is loaded on the above-stated substrate FPC. In this Figure, two chips CHI are loaded on the chip-loading section 1 of the substrate FPC as disposing them between the openings 4a, 4b in parallel so as to complete the substrate assembly BND. One of the chips CHI is constructed by integrating two blocks of 1 Mbit as shown in an enlarged plan view of FIG. 6. Thus, two chips CHI have four blocks, that is, totally compose a 4 Mbits chip. Further, in one block of the chip CHI shown in FIG. 6, a large line shows a conductor pattern and a thin line shows a chevron pattern propagation path. The chip CHI shown in FIG. 5 is loaded by means of the lead-bonding using Au-Sn eutectic crystal caused by a pressure welding method as disposing a gold bump 15 between respective bonding pads 14 provided by gold-plating at the end of the chip CHI and the wiring leads 9a on which the tinning layer 11 is formed in the opening 4 of the substrate FPC as respectively shown in enlarged sectional views of FIGS. 7A and 7B.

According to the above-stated construction, it is possible to fixedly support the chip CHI by connecting the lead wires 9a in the openings 4a, 4b of the substrate FPC with the bonding pads 14 of the chip CHI by means of the lead-bonding using Au-Sn eutectic crystal. Accordingly, it is possible to greatly ameliorate strength for connection and thin the construction. Further, the surface of the chip CHI is covered by the chip-loading section 1 of the substrate FPC. Thus, the surface of the chip CHI is protected and at once it is possible to ameliorate handling efficiency and to hold mechanical strength of the substrate FPC. Moreover, according to the above-stated construction, since each chip CHI consists of two blocks and two chips CHI are composed of 4 blocks, respective blocks can be distributively connected to respective connecting sections 3a, 3b, 3c, 3d which are the closes to respective blocks and thus the symmetric position of the chips CHI can be obtained so as to extremely facilitate a test, a check and the like. Further, since the substrate FPC provides four connecting sections 3a, 3b, 3c, 3d, it is possible to give and receive an input and an output signals having least noise by means of separating wirings for magnetic bubble detectors DET, map loops of each chip CHI and the like from the other wiring functions and aggregating them at one connecting section (refer to FIG. 6) and selectively disposing this connecting section at the location which is far away from a noise-generating source.

(Driving magnetic circuit; FIGS. 8 and 9)

Figure 8A:
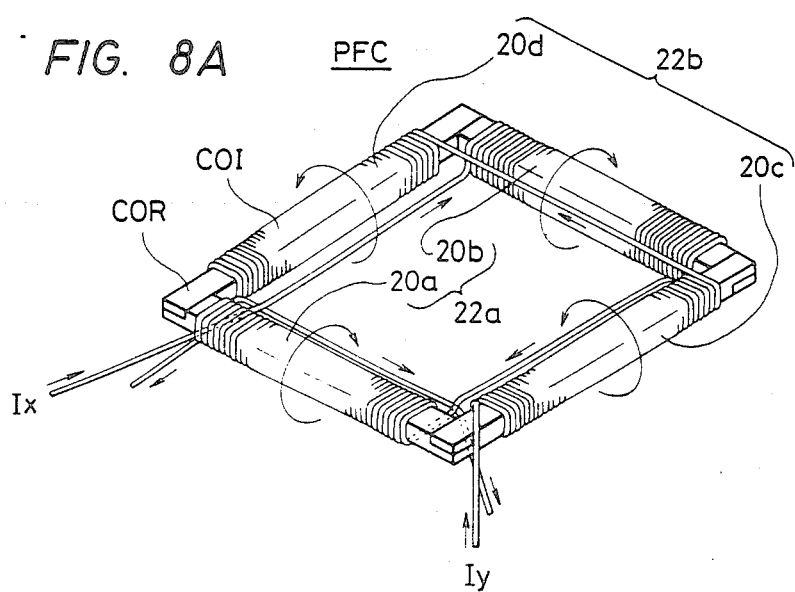
FIGS. 8A and 8B are a view describing a magnetic circuit PFC.
Figure 8B:
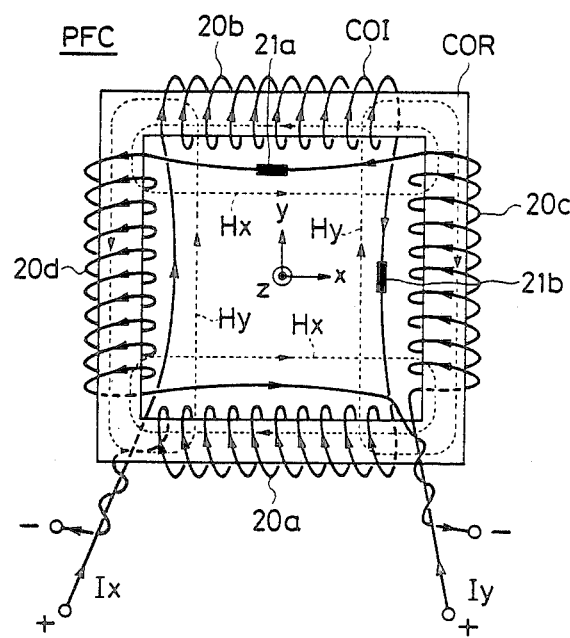
Figure 9:
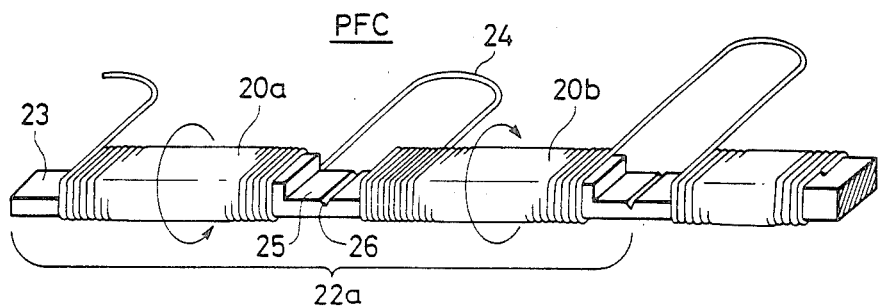
FIG. 9 is a view describing a producing method of the magnetic circuit PFC.

FIG. 8 shows the magnetic circuit PFC. FIG. 8A is a perspective view. FIG. 8B is a plan view showing the driving magnetic circuit. In these drawings, in the magnetic circuit PFC, a coil COI composed of four coils 20a, 20b, 20c and 20d by providing wirings (in the arrow direction are provided on the parallel sides facing to each other of the picture frame type of core COR made of soft magnetic materials and a X-coil 22a is composed by accomplishing series winding of the coils 20a and 20b on the sides facing to each other by way of a contact 21b and a Y-coil 22b is composed by accomplishing series winding of the coils 20c and 20d by way of a contact 21a. And, by supplying the X-coil 22b and the Y-coil 22b with currents Ix and Iy whose phase difference is 90° (for example, triangular wave current), as shown in FIG. 8B, leakage magnetic fields Hx and Hy are respectively generated in the x-axial direction and in the y-axial direction so as to supply the above-stated two chips CHI with them as a revolving magnetic field.

Further, the magnetic circuit PFC constructed as stated above is completed by the step of, as shown in a perspective view of FIG. 9, providing windings in a rectangular parallelepiped-like magnetic core 3 made of one soft magnetic material and a tap 24 at each plural blocks, forming a pair of coils, for example, a pair of X-coils 22a composed of the coils 20a, 20b, by accomplishing series winding and providing a wider groove 25 and a less wide groove 26 respectively having fixed widths between respective coils 20a and 20b by means of cutting work, afterwards, engaging the wider grooves 25 divided into two parts at the center of this less wide groove 26 with each other rectangularly and attaching them so as to buildup a picture frame type of core as shown in FIG. 8. Further, reversely, the rectangular parallelepiped core 23 forming the above-stated wider groove 25 and less wide groove 26 in advance can provide the coil 20a and the coil 20b by way of the tap 24 so as to form a pair of X-coils 22a. Moreover, the above-stated pair of Y-coils 22b can be formed quite similarly with the X-coils.

Under the construction stated above, since the rectangular parallelepiped core 23 provides the coils 20a, 20b as providing the tap in the series direction, in case of completing the construction by assembling as shown in FIG. 8, there is no need to connect lines (contact) as crossing them with each other and thus it is possible to simplify winding.

According to the construction stated above, since the X-coil 22a and the Y-coil 22b are made to be symmetric, coarse coupling is brought about. Thus, it is possible to ameliorate an inductance balance and to prevent magnetic interference among magnetic materials in relation to a leakage magnetic field. Moreover, this magnetic circuit PFC is made to have a picture frame type of structure and thus is not disposed on the upper or the lower surface of the chip CHI. Thus, the thickness in the lamination direction is made smaller and thus the thinning of the circuit can be realized.

(Case for confining a revolving magnetic field; FIGS. 10, 11 and 12)

Figure 10A:
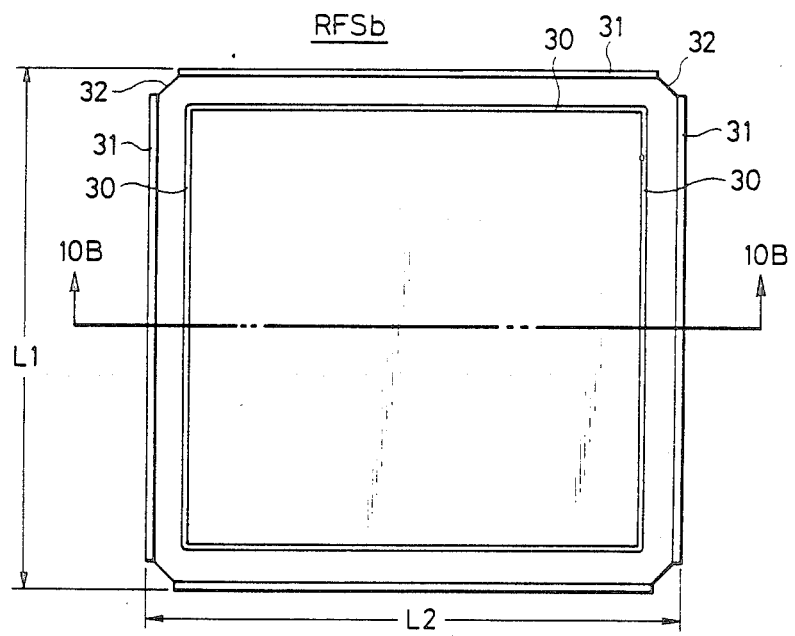
FIGS. 10A and 10B are a view showing an inner case RFSb.
Figure 10B:
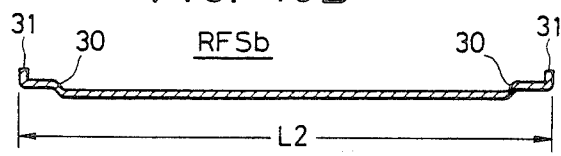

FIG. 10 shows the inner case RFSb. FIG. 10A is a plan view. FIG. 10B is a sectional view taken on the line 10B—10B of FIG. 10A. In the drawings, the inner case RFSb is built up of a frame type of drawn section 30 providing a concave portion at its center, bent sections 31 made by bending a pair of opposite side edges to each other upwardly about 90° and cut-away sections 32 made by cutting respective four corners in the slanting direction. This case RFSb is formed by press working of excellent conducting materials, for example, an oxygen free copper plate. In this case, the drawn section 30 and the bent sections 31 have a function of ameliorating mechanical strength of this inner case RFSb in the spiral direction and at once to suitably restrict outer length L in the vertical and transversial directions between each opposite bent sections 31 to each other. Further, the drawn section 30 can suitably arrange the distance between the magnet body BIMb disposed at the outer surface sides of this case RFSb and the chip CHI disposed at the inner surface side thereof. Besides, the cut-away sections 32 provided at the four corners form the drawing section of respective sections 2a, 2b, 2c, 2d to be bent of the substrate FPC disposed in this case RFSb.

According to the construction described above, it is possible to form the inner case RFSb by the press work. Thus, it can be manufactured in highly accurate dimensions and at low cost.

Further, for the inner case RFSb, oxygen free copper is employed, but it is possible to employ copper, silver, or gold plate or the plate made by planting the alloy plate of these materials.

FIG. 11 shows the outer case RFSa corresponding with the above-stated inner case RFSb. FIG. 11A is a plan view. FIG. 11B is a sectional view taken on the line 11B—11B. In the drawings, this outer case RFSa is produced by using the same materials and manufacturing method with the above-stated inner case RFSb. It is comprised of a frame type of drawing section 33 providing a concave portion at its center, bent sections 34 made by bending two pairs of opposite side edges upwardly about 90° and cut-away sections 35 made by cutting away respective four corners in the slanting direction, similarly with the above-stated case. In this case, two pairs of bent sections 34 are formed to have the almost same inside length between the opposite bent sections with the outside length L between the corresponding opposite bent sections of said inner case RFSb and higher height H than those of said inner case RFSb. Moreover, these drawn section 33 and cut-away sections 35 are formed to have the almost same dimensions with those of said inner case RFSb.

The outer case RFSa and the inner case RFSb as constructed above are assembled to be an integrated case RFS by means of inserting the inner case RFSb into the outer case RFSa and connecting them with each other to make the inner case RFSb be in contact with the outer surfaces of the bent sections 31 of the outer case RFSa, as shown in FIG. 12A which is the plan view of the case RFS and in FIG. 12B which is the sectional view taken on the line 12B—12B of FIG. 12A.

Figure 13:
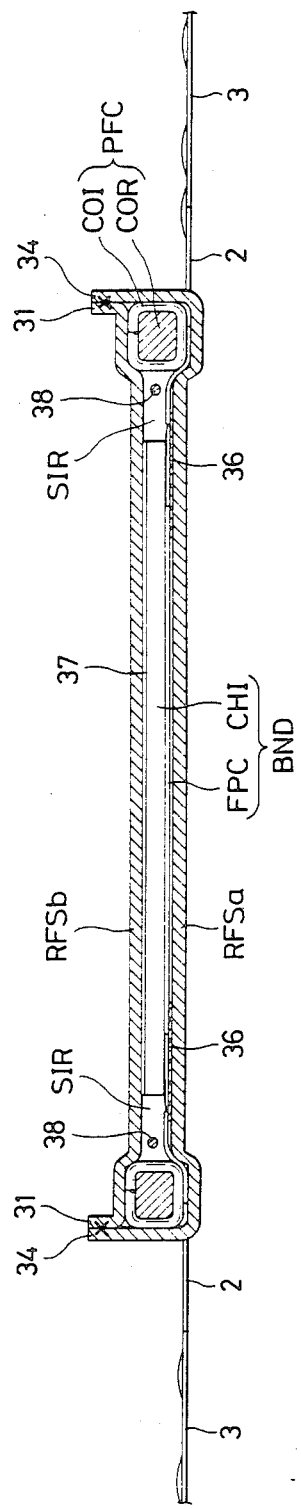
FIG. 13 is a sectional view showing an assembly case RFS in which the substrate assembly BND and the magnetic circuit PFC are accomodated.

(Case assembly; FIG. 13)

FIG. 13 is a sectional view showing the above-stated case RFS and the substrate assembly BND accomodated and disposed in said case. In this Figure, on the bottom of the outer case RFSa, for example, about 0.1 mm of thickness of polyamid film 36 is disposed and attached as an electrically insulating sheet. The substrate assembly BND and the magnetic circuit PFC are respectively disposed on this film 36 and the peripheral portion thereof. Further, an epoxy system adhesive agent 37 is coated on the upper surface of the substrate assembly BND and then, in the upper part of them, the inner case RFSb is inserted, disposed and joined. In this instance, the inner surfaces of the bent sections 34 of this outer case RFSa are mechanically and electrically jointed with the outer surfaces of the bent sections 31 of the inner case RFSb at the portions marked by X by means of metal flowing, soldering or the like. Silicon resin SIR fills in the gap between this outer case RFSa and this inner case RFSb so as to fixedly dispose the substrate assembly BND and the magnetic circuit PFC. Further, in this case, the sections 2 (2a, 2b, 2c, 2d) to be bent of the substrate FPC are drawn from respective cutaway sections 32, 35 not shown provided at the four corners of these outer case RFSa and inner case RFSb to the outside. 38 denotes a lead wire for connecting coils COI with each other or connecting the coil COI with an external terminal 9c provided on the substrate FPC.

Under the construction described above, in case of generating a leakage magnetic field by means of driving the magnetic circuit PFC, induced current is flown through the case RFS so as to form a closed loop. This induced current serves to confine a revolving magnetic field in the case RFS and thus the uniform revolving magnetic field is supplied to the chip CHI.

According to this construction, the chip CHI loaded on the substrate FPC and the magnetic circuit PFC are respectively disposed so as to be caught in the central concave portion and in the peripheral convex portion between the outer case RFSa and the inner case RFSb. Thus, it is possible to ameliorate a packaging effect and assembling efficiency much. Moreover, since the volume covered by the outer case RFSa and the inner case RFSb is diminished, a VI product ($\alpha$ volume) can be reduced and thus it is possible to miniaturize the magnetic circuit PFC for generating a revolving magnetic circuit. Further, by reducing a gap between the opposite concave portions by means of providing concave portions formed by the drawn sections 30, 33 on the outer case RFSa and the inner case RFSb, in the revolving magnetic field, only the vertical component to the level of the chip CHI (Z component) are made close to zero and thus only the horizontal component is left. Accordingly, it is possible to ameliorate uniformity of the magnetic field. Then, since the magnetic circuit PFC and the case RFS have a symmetric structure in relation to a vertical axis to the element surface of the chip CHI, it is possible to ameliorate the uniformity thereof much more.

(Magnet body; FIG. 14)

FIG. 14 shows the magnet body BIM. FIG. 14A is a plan view thereof. FIG. 14B is a side view thereof. FIG. 14C is an elevational view thereof. In these drawings, the magnet body BIM is formed by piling up an inclined plate INN made of nonmagnetic materials such as copper and having one predetermined inclined surface of the opposite surfaces, a plate HOM for homogenizing a magnetic field whose thickness is uniform and to be disposed at the inclined surface side of this inclined plate INN, a magnet plate MAG whose thickness is uniform and to be disposed at the upper surface side of this plate for homogenizing a magnetic field HOM and an inclined plate INM having an inclined surface and to be disposed at the upper surface side of this magnet body MAG and then integrating them by means of an epoxy system adhesive agent. Thus, it is formed so as to make the overall thickness of piling plates uniform. And, a uniform bias magnetic field can be radiated over the almost overall surfaces from the upper and the lower surfaces of this magnet body BIM.

(Bias coil; FIG. 15)

FIG. 15 shows a bias coil BIC. FIG. 15A is a perspective view thereof FIG. 15B is a sectional view taken on the line 15B—15B of FIG. 15A. In the drawings, the bias coil BIC is formed to be a picture frame type having a predetermined value by means of providing windings in order 40 on which, for example, thermosetting resin is coated as an insulated member so as to be disposed as $5 \times 4$ windings in section and to make the overall form picture frame-like and then pressure-welding the windings by thermal deposition and cooling it. In this case, the bias coil is formed by thermal-depositing thermosetting resin coated on the outer surfaces of respective windings 40 and loading respective windings 40 and loading respective windings 40 by pressure-welding. Then, by cooling it, respective windings 40 are hardened in the united state of windings and thus having a predetermined picture frame.

Figure 16:
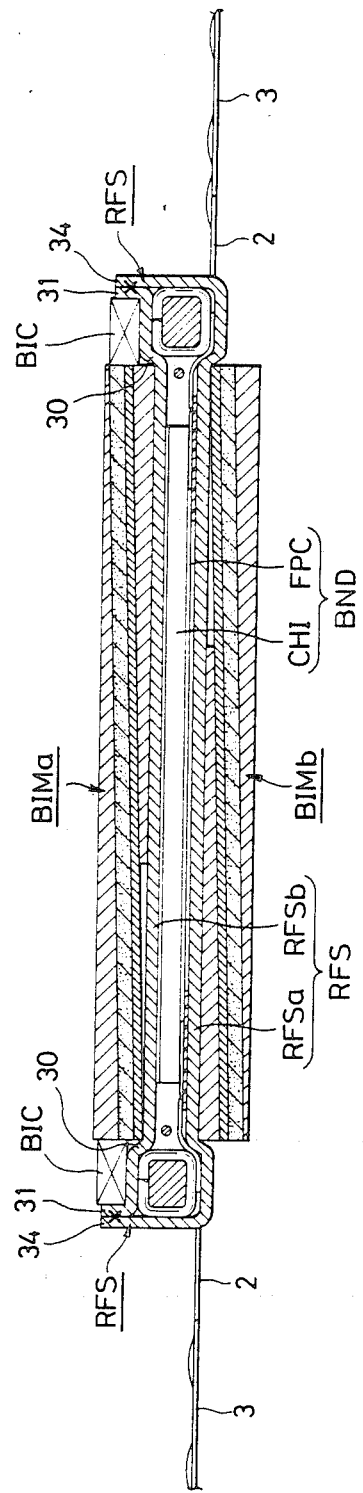
FIG. 16 is a sectional view showing an assembly of the case RFS with which a pair of magnets BIM and the bias coil BIC are incorporated.

(Mounting of the magnet body and the bias coil to the case assembly; FIG. 16)

FIG. 16 is a sectional view showing the case RFS described in FIG. 13, the above-stated magnet body BIM and bias coil BIC incorporated in the case. In this Figure, an upper magnet body BIMa and a lower magnet body BINb are respectively disposed and jointed on the upper and the lower surfaces of the case RFS assembly accomodated in the substrate assembly BND and the magnetic circuit PFC. And, the bias coil BIC is accomodated and disposed in a picture frame groove section formed by being surrounded by the peripheral portion of this upper magnet body BIMa and the bent sections of the inner case RFSb. In this instance, the upper magnet body BIMa and the lower magnet body BIMb are formed by means of the same materials and in the same dimensions with each other. These magnet bodies BIMa and BIMb at their inclined plate INN sides are respectively disposed closely in a concave portion surrounded by the drawn section 30 of the inner case RFSb and a concave portion surrounded by the drawn section 33 of the outer case RFSa.

According to the construction described above, it is possible to dispose a pair of magnet bodies BIMa and BIMb in the concave portions formed at both surfaces of the central part of the case RFS assembly and further provide the bias coil BIC in the picture frame groove formed in the peripheral section of those magnet bodies. Thus, the overall thickness of each component in the laminating direction is made smaller and the miniaturizing and thinning of the construction can be realized. Further, since the picture frame space groove is formed by the outer case RFSa and the peripheral portion of the upper magnet body BIMb, it is possible to dispose the above-stated bias coil BIC in this space groove, to newly provide a bias coil and further to form a bias coil by accomplishing windings as using the groove as a coil bobbin.

(Magnetic shield case; FIGS. 17, 18 and 19)

FIG. 17 shows an outer shield case SHIa. FIG. 17A is a plan view thereof. FIG. 17B is a sectional view taken on the line 17B—17B of FIG. 17A. In the drawings, the outer shield case SHIa is comprised of a flat section 51, bent sections 52 made by bending two pairs of opposite side edges of the flat section 51 upwardly about 90°, concave portion 53 made by cutting away part of the central parts of these bent sections 53 and cut-away sections 54 made by cutting respective four corners of these bent sections in the slanting direction. This outer shield case SHIa has high permeability and saturated flux density and it should be preferably formed by press-working materials with high thermal conductivity, for example, a Permalloy plate.

FIG. 18 shows an inner shield case SHIb corresponding with the above-stated outer shield case SHIa. FIG. 18A is a plan view thereof. FIG. 18B is a sectional view taken on the line 18B—18B of FIG. 18A. In these drawings, this inner shield case SHIb is formed by the same materials and manufacturing method with the outer shield case SHIa stated above. It is comprised of, similarly with the above, a flat section 55, sections 56 made by bending two pairs of opposite side ends upwardly about 90°, concave portions 57 made by cutting away part of the central parts of these bent sections 56 and cut-away sections 58 made by cutting respective corners of these bent sections. In this instance, each opposite bent sections 56 have the almost same outside length between them with the inside length L4 between each opposite bent sections 52 of the above-stated outer shield case SHIa and the height H of the inner shield case SHIb is lower than that of the outer shield case SHIa.

Figure 19A:
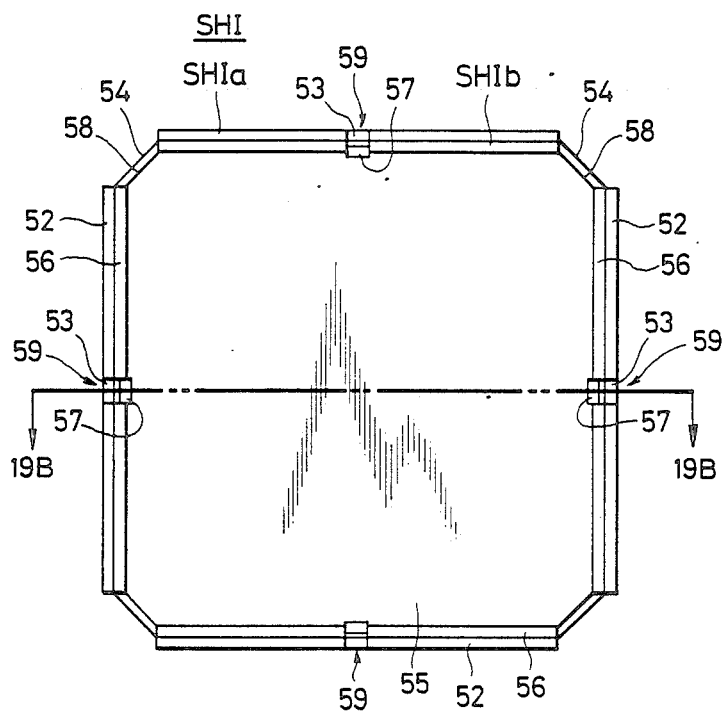
FIGS. 19A and 19B are is an assembly drawing showing a shield case SHI.
Figure 19B:
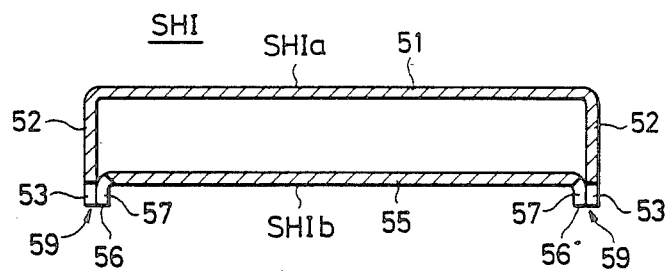

FIG. 19A is a plan view showing the outer shield case SHIa and the inner shield case SHIb constructed above. FIG. 19B is a sectional view taken on the line 19B—19B. The shield case SHI is integrally built up by means of inserting the inner shield case SHIb in the outer shield case SHIa and accomplishing spot-welding or solder-welding in relation to the concave portion 59 formed by the concave portion 53 of the outer shield case SHIa and the concave portion 57 of the inner shield case SHIa so as to magnetically and mechanically fix both shield cases with each other. In the construction described above, by arranging the bent sections 52 of the outer shield case SHIa and the bent sections 56 of the inner shield case SHIb in the lateral direction, that is, the direction crossed to the laminating direction but in the laminating direction, it is possible to make the dimensions in the lateral direction smaller and thus to miniaturize the construction and highly integrate components.

Figure 20:
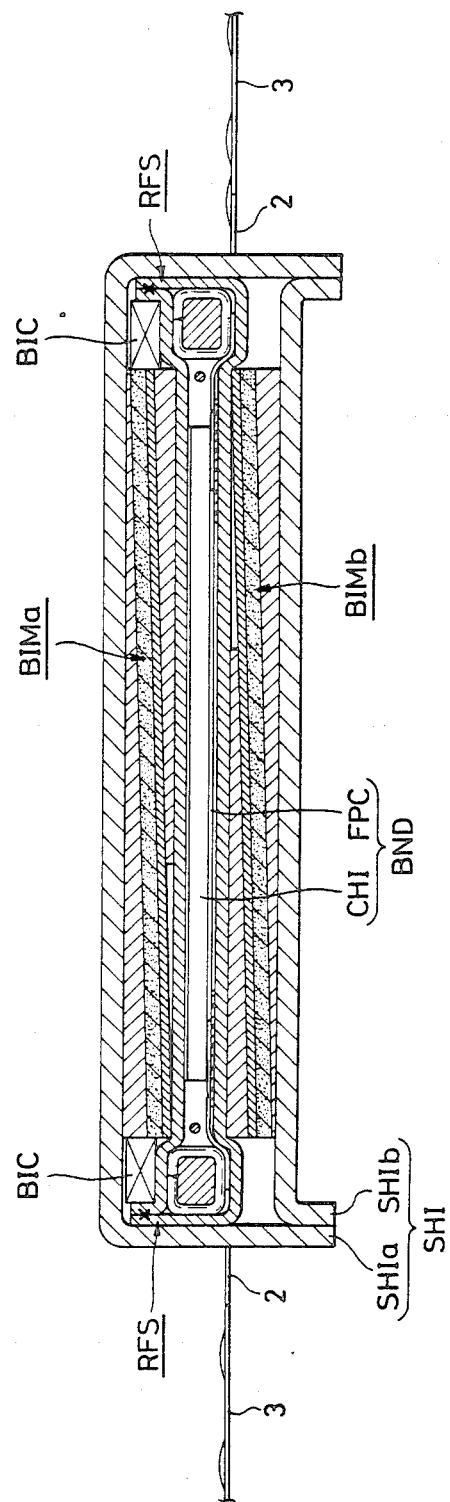
FIG. 20 is a sectional view showing the assembly shown in FIG. 16 incorporated in the shield case SHI.

(Magnetic shield case assembly; FIG. 20)

FIG. 20 is a sectional view showing the above-stated shield case SHI assembly, the case RFS assembly incorporating the substrate assembly BND and the magnetic circuit PFC therein as described in FIG. 16 and the assembly consisting of a pair of magnet bodies BIMa and BIMb and the bias coil BIC respectively incorporated in said shield case SHI assembly. In this Figure, in the inside of the outer shield case SHIa, the upper magnet body BIMa at the bottom to the center, the bias coil BIC at the peripheral portion, the case RFS assembly (incorporating the substrate assembly BND, the magnetic circuit PFC and the like therein), the lower magnet body BIMb are sequentially laminated and disposed and then the inner shield case SHIb is inserted to the outer shield case. Both shield cases are sealed with each other by means of welding the concave portion 59 (refer to FIG. 19) formed by the concave portion 53 of the outer shield case SHIa and the concave portion 59 of the inner shield case SHIb stated above. In this case, if grease or the like is made to fill in this shield case SHI, the components staying therein are substantially and closely attached with one another and the heat generated in this case RFS can be dissipated to the outside through this shield case SHI. Further, it is possible to ameliorate a dissipating effect by employing the structure wherein the case RFS and the shield case SHI are in contact with each other by means of a press fitting system.

Under the construction stated above, by laminating in order the case RFS assembly on the bottom of the outer shield case SHIa as confronting these bent sections 31, 34 with each other, respective components laminated between the outer shield case SHIa and the inner shield case SHIb are closely disposed. Thus, it is possible to miniaturize and thin the shield case and at once to obtain a dissipating effect.

(Packaging case; FIG. 21)

Figure 21A:
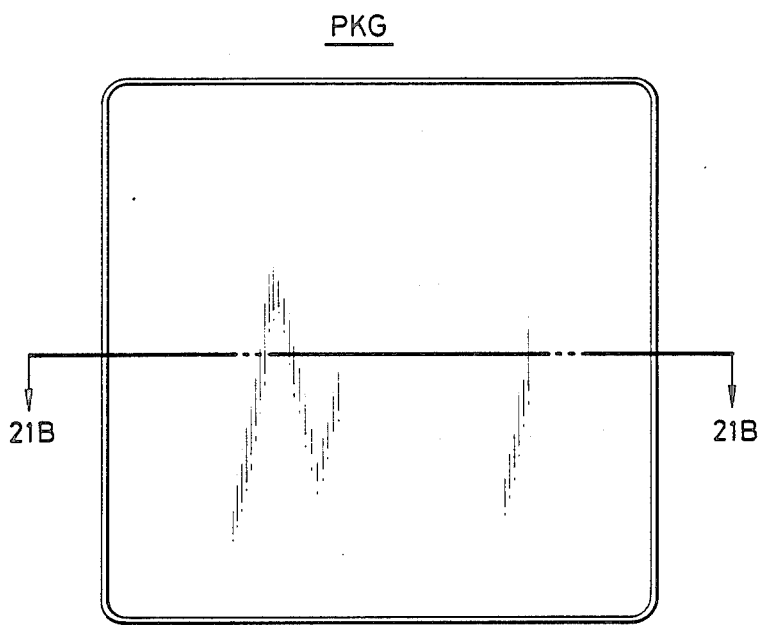
FIGS. 21A and 21B are is a view showing a packaging case PKG.
Figure 21B:
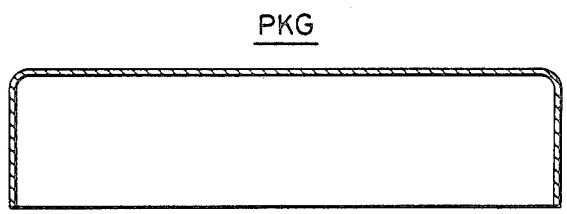

FIG. 21 shows a packaging case PKG. FIG. 21A is a plan view thereof. FIG. 21B is a sectional view taken on the line 21B—21B. In the drawings, the packaging case PKG can be formed by means of accomplishing the drawing to the materials with excellent thermal conductivity, for example, an aluminum plate whose thickness is about 0.5 mm. And, a black coat (not shown) is provided on the outer surface of the case. It is possible to utilize the above-stated outer shield case SHIa as a packaging case PKG by improving the form of said outer shield case.

Under the construction, this packaging case PKG serves as an outer case given after completion of a magnetic bubble memory module and has a function as a dissipating member. Besides, the inside corner sections thereof has a function as a mold in case of resin molding by means of a potting method stated after.

(Terminal-fixing plate and Contact pad; FIGS. 22 and 23)

FIG. 22 shows a terminal-fixing plate TEF. FIG. 22A is a plan view thereof. FIG. 22B is a sectional view taken on the line 22B—22B. FIG. 22C is a rear elevation thereof. In the drawings, the terminal-fixing plate TEF is made of electrically insulating materials, for as a glass epoxy system resin plate 60 and is formed to have such length and breadth as to freely put in or out of said packaging case PKG. And, on the surface of this resin plate 60 except its peripheral portion, a plurality of through holes 61 are provided in matrix arrangement with a predetermined interval in the breadth and length direction. At the corner portion of the through hole block, a non-through hole 62 which is rotationally symmetric and has a concave in section is provided. There is attached a mark 63 such as a white coat for indicating direction or distinction in this non-through hole 62. Further, a plurality of through holes 61 provided in this resin plate 60 provide openings 64 with a large diameter axially connected with through holes at the rear side of the resin plate as shown in FIG. 22B. These openings 64 all have depth of about 60% of the plate thickness and are respectively connected with the through holes 61 as having steps on the way of connection. Further, at the rear side of this resin plate 60, there is formed along the peripheral portion a groove 65 which has the almost same depth with the depth of said openings, different width in the horizontal direction therefrom and a concave state in section. The inside of this groove 65 serves as the passage section and the connection section of the coil COI windings and the bias coil BIC windings stated above. Further, the corner portions of this resin plate 60 are not formed as concave forms. They have a predetermined plate thickness and serve as contact surfaces to the inner side surfaces of the above-stated packaging case PKG. As stated above, the rear side of the resin plate 60 is formed to have a two-stepped structure which, namely, has two thicknesses.

Figure 23A:
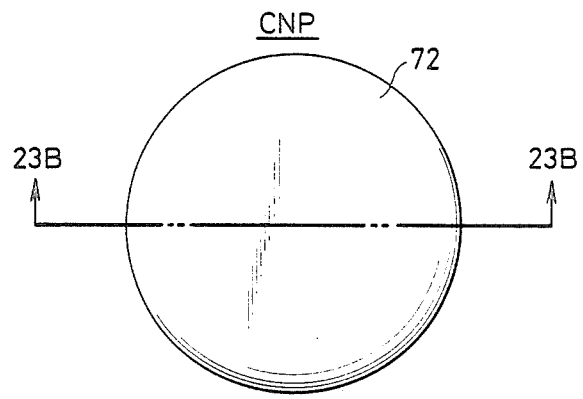
FIGS. 23A and 23B are is a view showing the construction of a contact pad CNP.
Figure 23B:
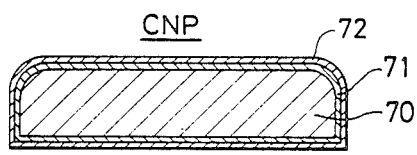

FIG. 23 shows a contact pad CNP. FIG. 23A is a plan view thereof. FIG. 23B is a sectional view thereof. In these drawings, the contact pad CNP is formed by means of accomplishing pressing work of good conducting materials, for example, a copper plate whose thickness is about 0.5 mm to punch out a piece member 70 and then forming a nickel-plating layer 71 and a gold-plating layer 72 on the surface of the piece member 70.

(Final assembly; FIGS. 20, 4 and 2)

Of respective components constructed as described above, at first, the shield case assembly described in FIG. 20 is inserted to the packaging case PKG stated above. Under this state, respective connecting sections 3a, 3b, 3c, 3d of said substrate assembly BND (refer to FIG. 4A) are projected from the four corners of this packaging case PKG as bent at about 90 degrees on the basis of respective sections to be bent 2a, 2b, 2c, 2d. Next, respective components are fixedly disposed in this packaging case PKG by accomplishing a resin-molding to the four corners of this packaging case PKG by means of a potting method. And, these connecting sections 3a, 3b, 3c, 3d are respectively bent about 90 degrees by the corresponding sections to be bent 2a, 2b, 2c, 2d and then are engaged on the outer surface of the inner shield case SHIb through an adhesive agent as shown in FIG. 4B. Then, the contact pads CNP are loaded in respective openings provided on the rear side of said terminal-fixing plate TEF or the sides of the contact pad CNP are made solid by means of an adhesive agent and then the treated contact pads CNP are inserted in the packaging case PKG so as to be disposed in contact with respective connecting sections 3a, 3b, 3c, 3d. In this instance, the arrangement pitch of respective external terminals 9b provided on respective connecting sections 3a, 3b, 3c, 3d corresponds with the arrangement pitch for respective contact pads CNP. Thus, respective external terminals 9b are electrically in contact with the contact pads CNP. Next, a heated thing whose tip is slender or something like that is inserted to each through hole 61 from the rear side of the disposed terminal-fixing plate TEF so as to attach the contact pads CNP with the external terminals by pressure welding. Consequently, respective external terminals 9b are electrically connected with the corresponding contact pads CNP and at once the terminal-fixing plate TEF is mechanically fixed to the contact pads so as to complete the magnetic bubble memory module as shown in FIG. 2.

(Magnetic bubble memory chip; FIGS. 24, 25, 26, 27 and 28)

Figure 24:
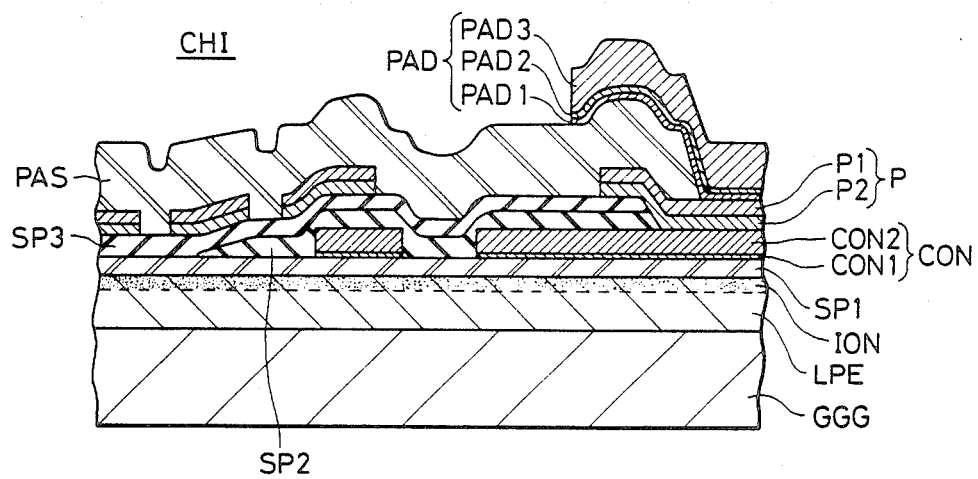
FIG. 24 is a sectional view showing the chip CHI.

FIG. 24 is a sectional view showing the portion around the bonding pad PAD of the magnetic bubble chip CHI stated above. In this Figure, GGG (gadolinium - gallium - garnet) denotes a substrate. LPE denotes a bubble magnetic film formed by means of a liquid phase epitaxial growth method. One example of its composite is referred in the following Table 1.

TABLE 1

| | Item | Characteristic |
|---|---|---|
| bubble film | composite | $(YSmLuC)_3(FeGe)_5O_{12}$ |
| | film thickness | 1.75 $\mu$m |
| | magnetic bubble diameter | 1.75 $\mu$m |
| | extinction magnetic field | 280 Oe |
| | saturated flux density | 480 Gauss |
| | bit period | 7.0 $\mu$m |
| chip | spacer thickness | 0.3 $\mu$m |
| | transfer pattern-forming method | RF sputtering method |
| | Fe—Si film thickness | 2500 Å |
| | Permalloy film thickness | 1500 Å |
| | transfer pattern dimensions | minimal line width 1.0 $\mu$m |
| | | minimal gap 1.0 $\mu$m |

ION denotes an ion-implanted layer formed on a LPE film surface for restraining hard bubbles. SP1 denotes a first spacer which serves to form, for example, $SiO_2$ whose thickness is 3000 Å by means of a gaseous phase chemical reaction. CON 1 and CON 2 denote two conducting layers and has a function of controlling generation of bubbles, duplication (division) thereof and exchanging thereof as stated above. A lower first conducting layer CON 1 and an upper second conducting layer CON 2 are respectively made of materials such as Mo and those such as Au. SP2 and SP3 respectively denote layer-insulating films (a second and a third spacers) made of polyimide resin or the like for performing electrical insulation between the conducting layers CON and a transfer pattern layer P made of Permalloy or the like formed thereon. PAS denotes a passivation film formed out of a $SiO_2$-film or the like formed by means of a gaseous phase reaction method. PAD denotes a bonding pad of the chip CHi, where a fine connector wire such as a A-wire or the like is bonded by means of a pressure welding method or a supersonic method. In this bonding pad PAD, a lower first layer PAD 1, a middle second layer PAD 2 and an upper third layer PAD 3 are respectively formed out of materials such as Cr, those such as Au and those such as an Au-planting layer. It is possible to form the second and the third layers PAD 2 and PAD 3 out of the materials such as Cr, Cu or the like. P denotes the layer utilized as a transfer path of bubbles, a dividing, a generating, an exchanging and a searching section of bubbles and a guardrail section. In the description stated after, it is described as a transfer pattern layer for convenience' sake.

As an example shown in FIG. 24, this transfer pattern layer P employs Fe - Ni as a lower layer P1 and an upper layer P2, but it is possible to exchange both materials with each other as stated before.

Figure 25:
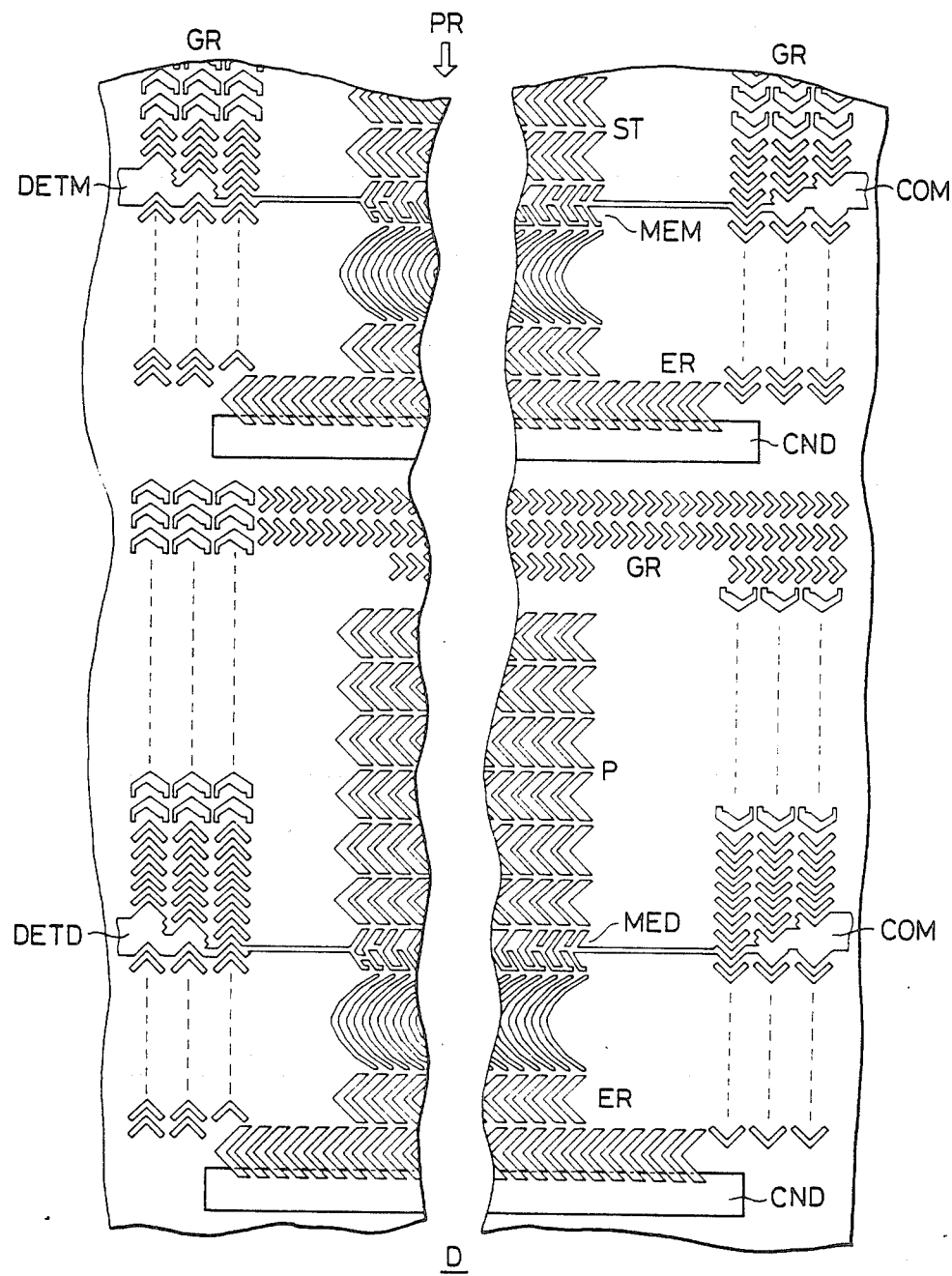
FIG. 25 is a view showing the construction of a magnetic bubble detector D of the chip CHI.

Hereinafter, the example in which a multilayered transfer pattern layer is applied for respective sections of the chip CHI with reference to the plan views of FIG. 25 and the drawings thereafter. In these plan views, each layer of the transfer pattern layer is formed by a self alignment and thus attention should be payed to the layers expressed by the same contour therewith. FIG. 25 shows a D section of a bubble detector. MEM denotes a main magnetic resistance element for detecting the existence of bubbles by means of variation of a resistance value provided in case of passing the bubbles extended like a band in the lateral direction through the element. MED denotes a dummy magnetic resistance element having the same pattern form with those of the main magnetic resistance element and is utilized for detecting noise components brought about by the influence of a revolving magnetic field and the like. At the upper side of the main magnetic resistance element MEM, there are formed scores of steps of bubble stretchers ST for transferring the bubbles downwardly as stretched in the lateral direction though only the two steps thereof are shown in the drawing. Further, PR denotes the transfer direction of bubbles. ER denotes a bubble eraser and serves to erase bubbles when they attain to the conducting layer CND. The guardrail GR consisting of pattern blocks lining up in three files is provided around this detector D and between the dummy and the main detections and serves to get the unnecessary bubbles generated in the inside of the guardrail GR out of the guardrail and to prevent entering the unnecessary bubbles generated in the outside of the guardrail GR into the inside thereof. Further, in the plan pattern views after FIG. 25, the patterns except the conducting layer CND pattern show the transfer pattern layer P described in FIG. 24. In FIG. 25, a signal-to-noise ratio (S/N ratio) is ameliorated by means of forming the magnetic resistance elements MEM and MED by a multilayered magnetic layer. For example, in case of utilizing a three-layered Permalloy layer laying a $SiO_2$-film as a transfer pattern between respective layers, it is possible to ameliorate a S/N ratio over doubly in comparison with the case of using a Permalloy single layer as shown in the following Table 2.

TABLE 2

| | Single output S | Noise component | S/N ratio |
|---|---|---|---|
| single layer | 8 (mV) | 1.1 (mV) | 7.3 |
| three layers | 12 (mV) | 0.7 (mV) | 17 |

Further, the efficiency of the guardrail GR can be improved because of heightening a discharging factor for unnecessary bubbles by means of reducing retentiveness Hc.

Figure 26:
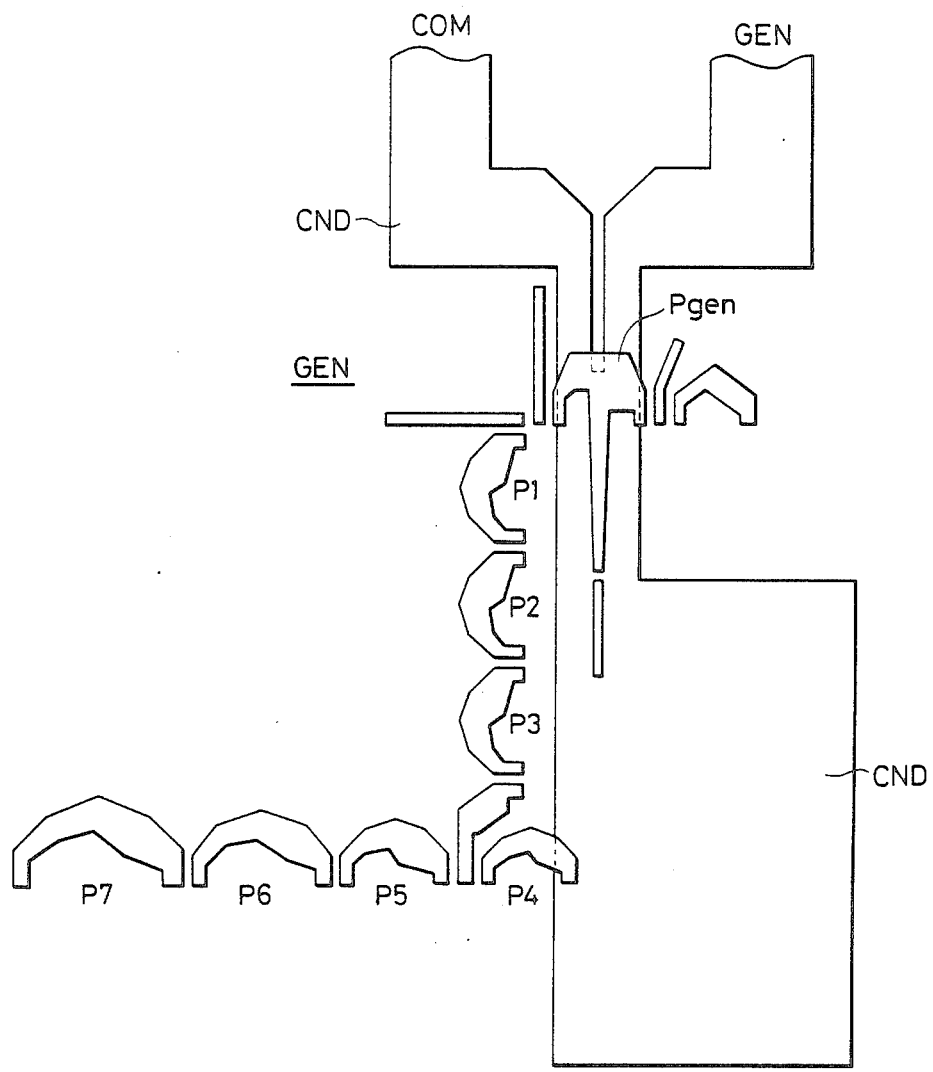
FIG. 26 is a view showing the construction of a magnetic bubble generator GEN of the chip CHI.

FIG. 26 shows a magnetic bubble-generator GEN. The current generated in the magnetic bubbles can be made smaller by making the transfer pattern layer P multilayered and thus it is made possible to lengthen the life of the conducting layer CND of the magnetic bubble-generator. Accordingly, the driving circuit for the conducting layer CND can employ a semiconductor element with a small current capacity value and thus its cost can be made lower.

Figure 27:
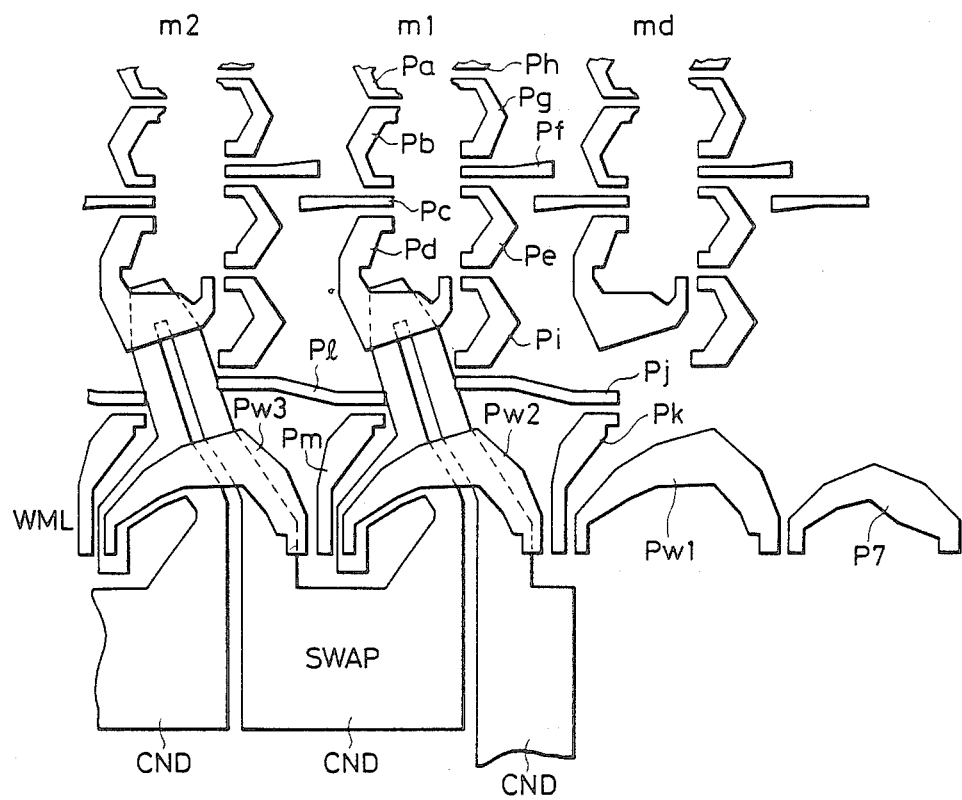
FIG. 27 is a view showing the construction of a swap gate SWP of the chip CHI.

FIG. 27 shows a minor loop m composed of transfer patterns such as Pa - Ph and the like, a write major line WML composed of the transfer patterns such as $Pw_1$ to $Pw_3$ and the like and a swap gate section composed of a hairpin conducting layer CND. In this Figure, P7 is the same with the transfer pattern P7 in the bubble-generator GEN shown in FIG. 26. In other words, the bubbles generated in the bubble-generator GEN are transferred to the write major line WML through the P1 to P7 transfer pathes. When the swap conducting layer CND is energized, the magnetic bubbles in the transfer pattern Pd of the minor loops ml are transferred through the transfer patterns Pl and Pm to the transfer pattern Pw3 of the major line WML and the magnetic bubbles from the major line Pwl are transferred through the transfer patterns Pk, Pj and Pi to the transfer pattern Pe of the minor loop in order to accomplish an exchange of bubbles, that is, informations with each other. Further, the swap gate is not provided in the minor loop md at the right end, because it is a dummy loop where magnetic bubbles are not injected for reducing a peripheral effect. As described above, it is possible to accomplish an exchange of magnetic bubbles with a small current value by means of making the transfer pattern layers Pi to Pm at the exchange location multilayered.

Figure 28:
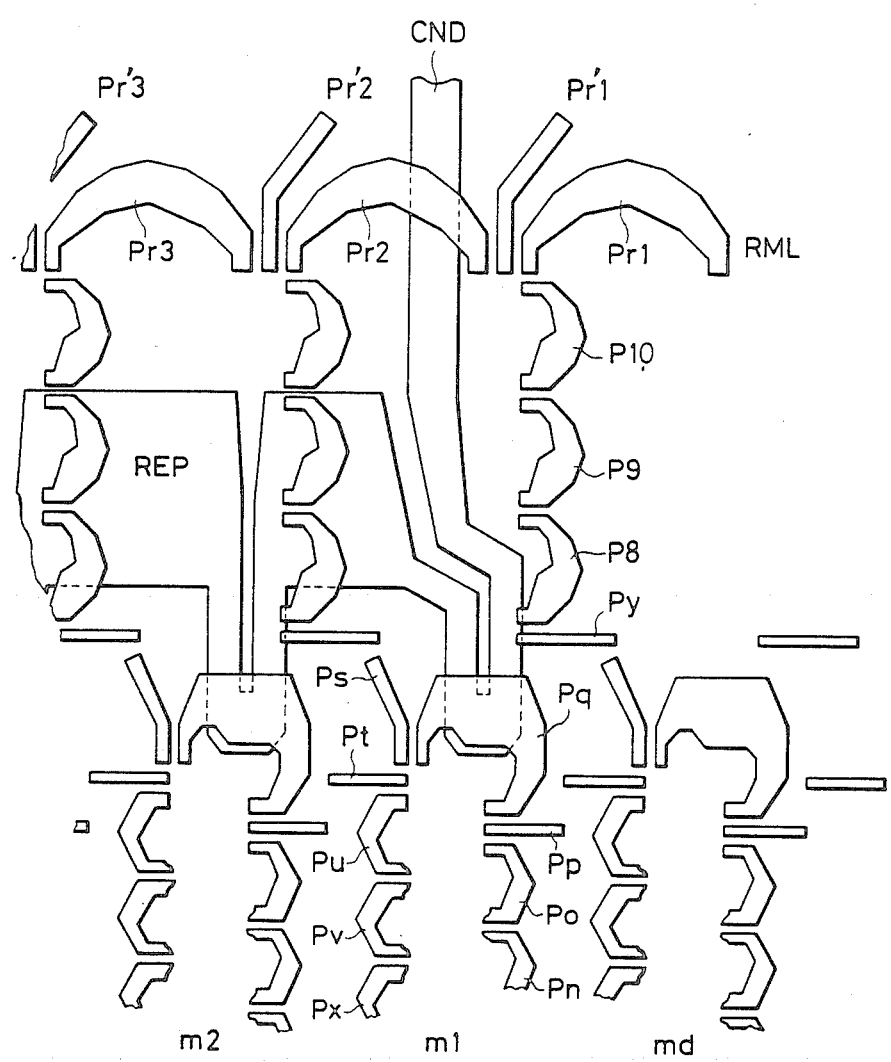
FIG. 28 is a view showing the construction of a replicate gate REF of the chip CHI.

Moreover, as shown in FIG. 28, similarly with the above, it is possible to accomplish the drive with a small current value by means of a duplicator for magnetic bubbles, that is, a diviser therefor. In this Figure, the magnetic bubbles are usually transferred on the route of Pn to Pg and Ps to Px. When the conducting layer CND is energized, the bubbles is divided at the location of the transfer pattern Pg and one divided magnetic bubble is transferred to a read major line RML by way of Py and P8 to P10.

(Holding magnetic field and Revolving magnetic field; FIG. 29)

The magnet body MAG is disposed as about 2 degrees tilted in relation to the chip CHI. This is designed to apply a bias magnetic field Hb to the chip CHI in the direction a little shifted from the vertical. Thus, it is possible to generate a holding magnetic field Hdc for ameliorating a start and a stop margins of the bubble transfer to raise about 6(Oe)(FIG. 29A).

Figure 29A:
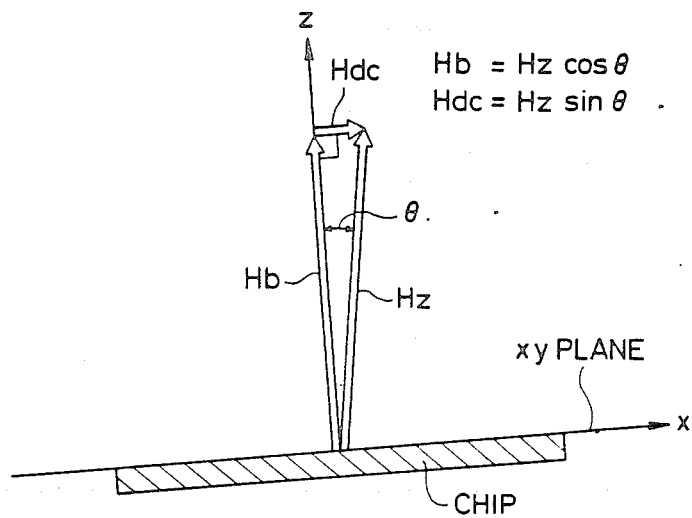
FIG. 29A is a view showing the relation between a bias magnetic field Hb and a holding magnetic field Hdc.

As shown in FIG. 29A, on account of the slant at a $\theta$ degree angle between the magnet body BIM and the chip CHI, the series magnetic field Hz is made to have a component Hdc on the xy plane. And, magnitude of this in-plane component Hdc is $Hdc \cdot \sin\theta$ and usually, the slanting angle $\theta$ is selected to be $Hdc \cdot \sin\theta = 5(Oe) - 6(Oe)$. Further, the direction of this in-plane component Hdc is slanted to coincide with the start and stop (St/Sp) direction in the revolving magnetic field Hr(+x-axis direction). This component Hdc on this xy plane is a well-known magnetic field effectively served as the start and stop (St/Sp) operation of the revolving magnetic field Hr and called as a holding field. Further, magnitude of the bias magnetic field Hb vertically functioned on the chip CHI plane is made to be $Hz \cdot \cos\theta$.

Figure 29B:
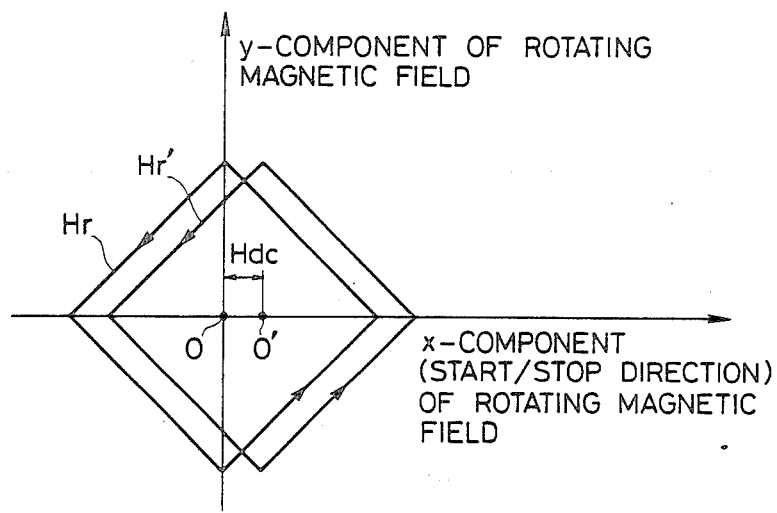
FIG. 29B is a view showing a total revolving magnetic field Hr'.

The above-stated holding field Hdc always functions on the xy plane of the chip CHI and thus the revolving magnetic field Hr' functioning to said chip CHI is made eccentric as illustrated in FIG. 29B. In this drawing, Hr denotes a revolving magnetic field applied from the external. Hr' denotes a revolving magnetic field functioning to the chip CHI. In this case, the revolving magnetic field Hr' functioning to the chip CHI is made to be a synthesis of the revolving magnetic field Hr applied from the external and the in-plane component Hdc and the center 0' of the revolving magnetic field Hr' is shifted in parallel by the in-plane component Hdc in the start and stop (St/Sp) direction, that is, +x-axis direction. Thus, as is obvious from the result of FIG. 29B, if the intensity of the revolving magnetic field Hr applied from the external is |Hr|, the intensity |Hr'| of the revolving magnetic field effectively functioning to the chip CHI is variable in accordance with the phase of the revolving magnetic field Hr. Namely, |Hr'| in the St/Sp direction is made to be |Hr|+|Hdc|, which is more intensified by the intensity Hdc of the holding field Hdc in comparison with |Hr|. Conversely, |Hr'| in the opposite direction to the St/Sp direction is made to be |Hr|−|Hdc|, which is made weaker by |Hdc| in comparison with |Hr|.

Figure 30:
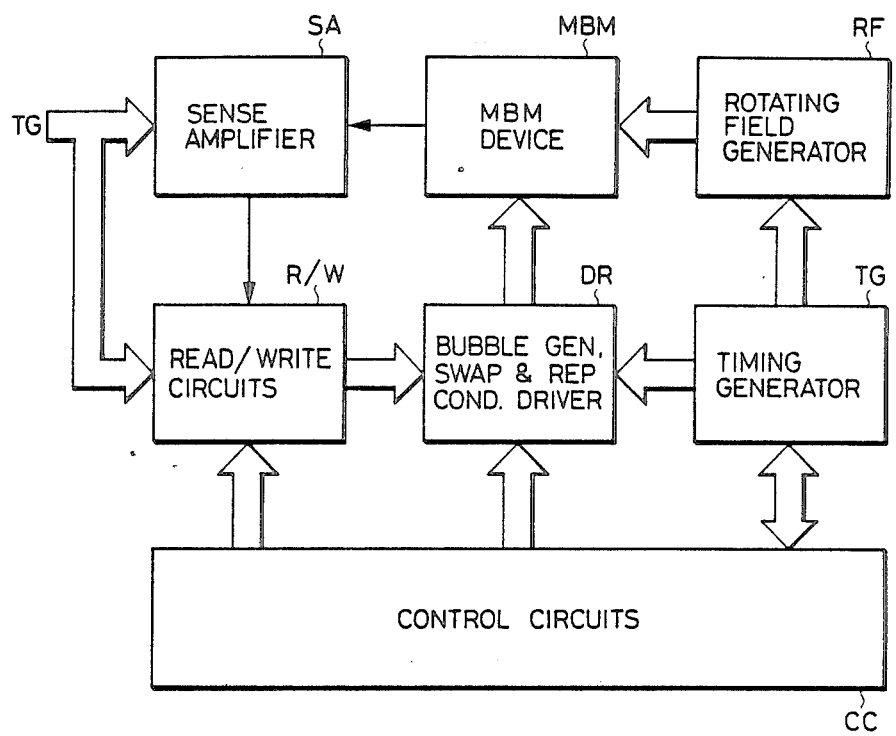
FIG. 30 is a view showing an overall circuit of a magnetic bubble board.

(Peripheral circuit; FIG. 30)

Lastly, a peripheral circuit of the chip CHI is described with reference to FIG. 30. RF denotes a circuit for generating a revolving magnetic field Hr by flowing the current whose phase difference is 90 degrees through the X- and Y-coils of the chip CHI. SA denotes a sense amplifier for sampling a minute bubble-detecting signal from the magnetic resistance element of the chip CHI in accordance with a timing of the revolving magnetic field, sensing and amplifying it. DR denotes a driving circuit for generating the bubbles in relation to the write in the magnetic bubble memory device MBM, flowing current through respective replicate functioning conductors in relation to swapping and reading in accordance with a predetermined timing and driving a bias coil BIC. The above-stated circuits are synchronized by means of a timing-generator TG so as to be operated in synchronization with a cycle and a phase angle of the revolving magnetic field Hr.

Figure 31:
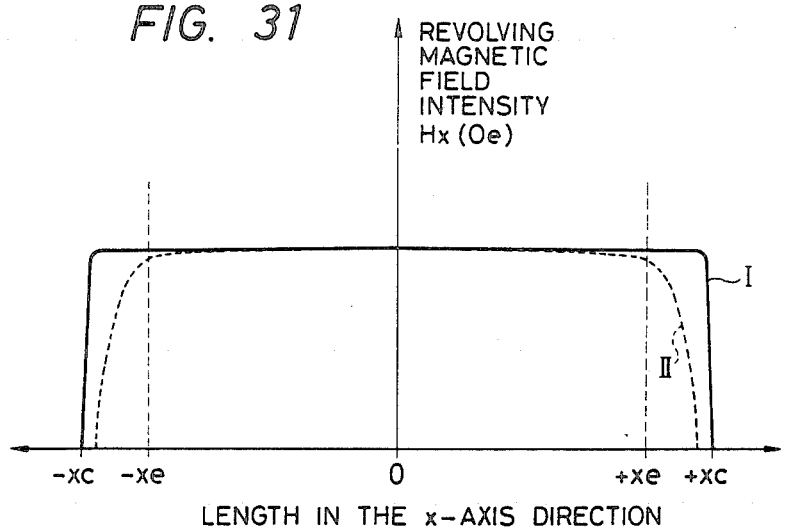
FIG. 31 is a characteristic view showing a revolving magnetic field distribution.

(Revolving magnetic field distribution characteristic; FIG. 31)

FIG. 31 shows a revolving magnetic field distribution characteristic of the above-stated magnetic circuit PFC. It means that in this Figure, when the axis of abscissas shows the length in the x-axis direction with 0 as the center of the magnetic circuit PFC shown in FIG. 8B and the axis of ordinates shows the revolving magnetic field intensity Hx in the x-axis direction in case of establishing the revolving magnetic field intensity in the x-axis direction Hx=0, the revolving magnetic field distribution characteristic as shown in the curve I can be obtained. As is obvious from this Figure, it is possible to obtain almost uniform revolving magnetic field intensity Hx in the range of $-Xc \sim +Xc$ of the distance between the insides of the core COR sides facing to each other in the magnetic circuit PFC and ±2% of uniformity of the magnetic field intensity in the range of $-Xe \sim +Xe$ of the effective area of the chip CHI (the minimal area to which a revolving magnetic field is to be applied). Further, the curve II shown by a broken line denotes a revolving magnetic field distribution characteristic.

(The other embodiments of Flexible substrate; FIGS. 32, 33, 34 and 35)

In the embodiment described above, there is described the example employing a flexible substrate FPC formed to be a windmill form. With regard to this substrate FPC, except this embodiment, various kinds of applications are brought about in accordance with the form of the outer connection terminal-connecting section 3 and the way of taking out it from the corner sections of the case RFS for confining a revolving magnetic field.

Figure 32:
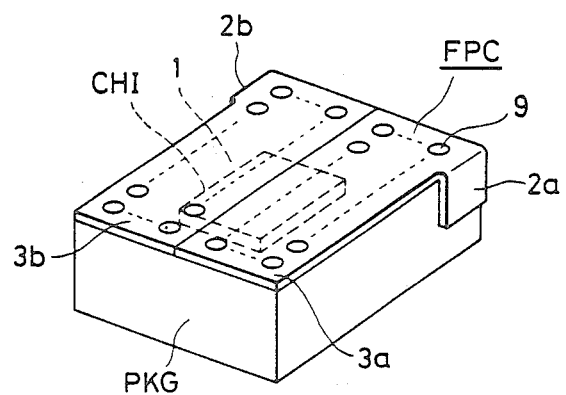
FIGS. 32 to 35 are perspective views showing 4 modules produced by improving flexible substrates.
Figure 33:
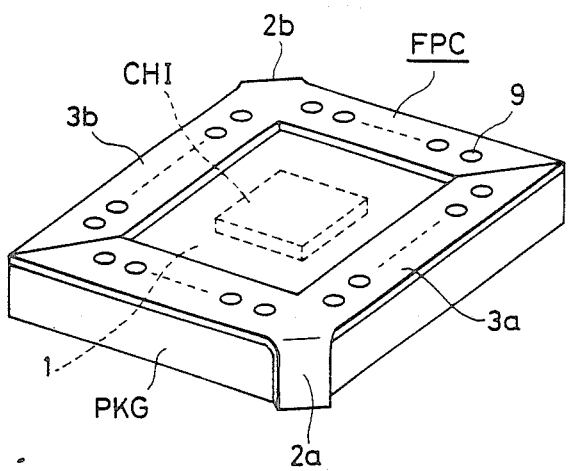

FIG. 32 shows the embodiment wherein two rectangular connecting sections 3a, 3b are extended from the upper side of a chip-loading section 1 in the right and the left directions and bent by the sections 2a, 2b. Further, FIG. 33 shows the embodiment wherein two Y-like connecting sections 3a, 3b are extended in the diagonal line direction and are bent by the sections 2a, 2b.

Figure 34:
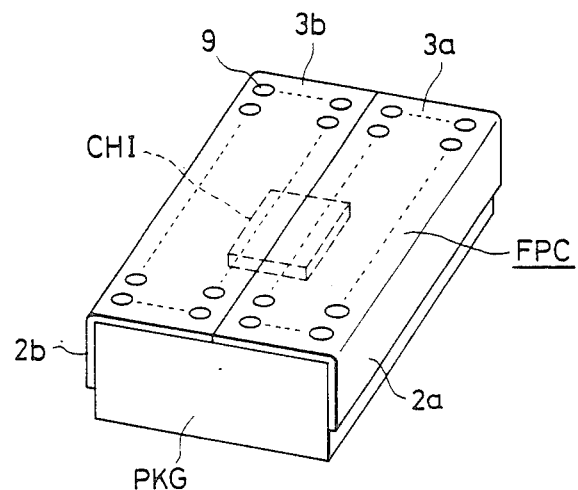
Figure 35:
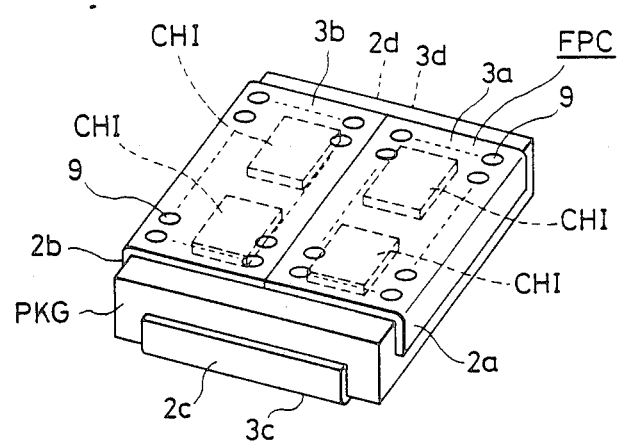

FIG. 34 shows the embodiment wherein there is employed a wholly rectangular substrate FPC providing connecting sections 3a, 3b on the right side and the left side and these sections are bent by the sections 2a, 2b. FIG. 35 shows the embodiment wherein four chips are loaded on a wholly cross-shaped substrate FPC and of four connecting sections 3a, 3b, 3c, 3d provided at respective tips of the substrate, two pairs of opposite connecting sections are respectively bent on the upper surface and the lower surface of the module. In FIG. 35, the connecting sections 3a, 3b are bent to the upper surface of the module by the sections 2a, 2b and the connecting sections 3c, 3d are bent to the lower surface of the module by the sections 2c, 2d and thus the substrate FPC has a three-layered structure as a whole. Further, in the embodiments shown in FIGS. 34 and 35, there is shown in the drawings the construction wherein respective sections to be bent are wholly drawn out of respective side surfaces of the case RFS for confining a revolving magnetic field in order to prevent complication of the drawings, but for the purpose of keeping uniformity of a magnetic field and reducing loss thereof, it is preferable to draw respective sections to be bent at the corners of the case RFS for enclosing a revolving magnetic field. Accordingly, a square hole should be provided at the root sections of respective sections to be bent and the bent sections 34 shown in FIG. 11 should be passed through these holes.

As described above, according to the present invention, it is designed to dispose the magnetic bubble memory chip loaded with the flexible substrate in the space section of the revolving magnetic circuit consisting of a picture frame core and to lay the overall body for confining a revolving magnetic field within the case, the body being made of good conducting materials, and to electrically connect the peripheral portion of the overall body with the case. Thus, it is possible to obtain quite excellent effects that a highly uniform revolving magnetic field can be obtained by a small VI product because of reducing the space for generating a leakage magnetic field and the magnetic bubble memory module which is designed to lower power consumption, miniaturize and thin the overall form and ameliorate assembling efficiency can be obtained because of miniaturizing the case for confining a revolving magnetic field.

What is claimed is:

1. A magnetic bubble memory module comprising:
a rectangular core shaped like a picture frame providing windings on respective two pairs of opposite sides;
at least one magnetic bubble memory chip disposed in the area surrounded by said core;
a flexible substrate having chip-loading section means disposed for loading said at least one magnetic bubble memory chip thereon, said chip-loading section means having four corners and including means for providing electrical connections for said at least one chip, said flexible substrate including lead wire section means extending from the four corners of said chip-loading section means and arranged for bending, and connecting section means for providing connections with said lead wire section means and for disposing external connection terminals on an outside surface of said module, said means for providing electrical connections of said chip-loading section means of said flexible substrate consisting of a three-layered structure of a first insulating layer, an intermediate wiring layer, and a second insulating layer;
a revolving magnetic field-confining case for accommodating said core, said at least one chip and said flexible substrate, said revolving magnetic field-confining case including means for enabling drawing out of said lead wire section means of said flexible substrate at the corners of said chip-loading section means.

2. A magnetic bubble memory module according to claim 1, wherein at least one of said first and second insulating layers of said flexible substrate comprises one of a transparent and semi-transparent material.

3. A magnetic bubble memory module according to claim 1, wherein said flexible substrate includes means for limiting at least one rectangular opening in at least one of said first and second insulating layers for exposing the intermediate wiring layer of said three-layered structure of said chip-loading section means, said at least one magnetic bubble memory chip being electrically connected with said intermediate wiring layer.

4. A magnetic bubble memory module according to claim 3, wherein said means for limiting said at least one opening forms two insulating layer portions with one of the insulating layer portions closer to said revolving magnetic field-confining case being smaller than the other insulating layer portion and forming a double-frame structure of said insulating layer portions.

5. A magnetic bubble memory module according to claim 3, wherein said intermediate wiring layer exposed by said opening is provided with a tinning layer.

6. A magnetic bubble memory module according to claim 3, wherein said flexible substrate includes means for limiting at least one opening in at least one of said first and second insulating layers for exposing said intermediate wiring layer of said three-layered structure of said chip-loading section means, said exposed intermediate wiring layer having a soldering layer thereon.

7. A magnetic bubble memory module comprising:
a rectangular core shaped like a picture frame providing windings on respective two pairs of opposite sides;
at least one magnetic bubble memory chip disposed in an area surrounded by said core, said at least one magnetic bubble memory chip dividing a bubble signal system of an output terminal block and a bubble driving system of the output terminal block into two parts, the respective two parts being disposed in areas spaced from one another;
a flexible substrate having chip-loading section means loading said at least one magnetic bubble memory chip thereon, said chip-loading section means having four corners, connection terminal section means including a signal system for electrical connection with said bubble signal system of said output terminal block of said at least one chip and a driving system for electrical connection with said bubble driving system of said output terminal block of said at least one chip, lead wire section means extending from said four corners of said chip-loading section means and arranged for bending, said lead wire section means having independent lead wires arranged for connection with said signal system of said connection terminal section means and said driving system of said connection terminal section means, and connecting section means for providing connection with said lead wire section means so as to lead respective lead wires to an outer surface of said module;
a revolving magnetic field-confining case accommodating said core, said at least one chip, said chip-loading section means, said connection terminal section means including said signal system and said driving system thereof, said revolving magnetic field-confining case including means for enabling the drawing out of said lead wire section means of said flexible substrate at the corners of said chip-loading section means.

8. A magnetic bubble memory module according to claim 7, wherein said at least one magnetic bubble memory chip comprises two integrated blocks having the same storage capacity.

9. A magnetic bubble memory module according to claim 7, wherein said chip-loading section means enables loading of two magnetic bubble memory chips, said lead wire section means respectively distributing the lead wires for the signal system and the driving system of said connection terminal section means for each chip to the connecting section means.

* * * * *